(12) United States Patent
Baets et al.

(10) Patent No.: US 8,787,417 B2
(45) Date of Patent: Jul. 22, 2014

(54) LASER LIGHT COUPLING INTO SOI CMOS PHOTONIC INTEGRATED CIRCUIT

(75) Inventors: Roeland Baets, Deinze (BE); Dries Van Thourhout, Ghent (BE); Gunther Roelkens, Schellebelle (BE); Geert Morthier, Ghent (BE); Yannick De Koninck, Emblem (BE)

(73) Assignees: Universiteit Gent, Ghent (BE); IMEC, Leuven (BE)

( * ) Notice: Subject to any disclaimer, the term of this patent is extended or adjusted under 35 U.S.C. 154(b) by 27 days.

(21) Appl. No.: 13/580,984

(22) PCT Filed: Feb. 24, 2011

(86) PCT No.: PCT/EP2011/052773
§ 371 (c)(1),
(2), (4) Date: Aug. 24, 2012

(87) PCT Pub. No.: WO2011/104317
PCT Pub. Date: Sep. 1, 2011

(65) Prior Publication Data
US 2012/0320939 A1 Dec. 20, 2012

(30) Foreign Application Priority Data

Feb. 24, 2010 (EP) ..................... 10154596
Mar. 19, 2010 (EP) ..................... 10157111

(51) Int. Cl.
*H01S 5/00* (2006.01)
(52) U.S. Cl.
USPC ........... 372/45.01; 372/1; 372/50.11; 372/64; 372/99
(58) Field of Classification Search
USPC ................. 372/1, 45.01, 50.11, 64
See application file for complete search history.

(56) References Cited

U.S. PATENT DOCUMENTS 7,257,283 B1 8/2007 Liu et al.
2009/0154517 A1 6/2009 Leem et al.

FOREIGN PATENT DOCUMENTS

FR 2909491 A1 6/2008
WO 2009136913 A1 11/2009

OTHER PUBLICATIONS

Fang et al., Electrically pumped hybrid AlGaInAs-silicon evanescent laser, Optics Express Oct. 2, 2006.*
Di Liang et al, "A compact electrically-pumped hybrid silicon microring laser", Communications and Photonics Conference and Exhibition, Nov. 2, 2009, pp. 1-2, XP031598797.

(Continued)

*Primary Examiner* — Dung Nguyen
(74) *Attorney, Agent, or Firm* — Bacon & Thomas, PLLC

(57) ABSTRACT

A hybrid laser for generating radiation includes an optical passive material and an optical active material. The laser includes a first optical waveguide and optical laser components with reflectors in the optical passive material. The first optical waveguide is adapted for coupling out radiation from the hybrid laser. The laser also includes a second optical waveguide defined in the optical active material. The optical laser components include reflectors defining a cavity and furthermore are adapted for providing laser cavity confinement in the first optical waveguide and the second optical waveguide. The second optical waveguide thereby is positioned at least partly over the first optical waveguide so that an evanescent coupling interface is defined between the second optical waveguide and the first optical waveguide and the evanescent coupling interface is positioned within the laser cavity.

17 Claims, 15 Drawing Sheets

(56) References Cited

OTHER PUBLICATIONS

Fang et al, "Electrically pumped hybrid AlGaInAs-silicon evanescent laser", Optics Express, Oct. 2, 2006, vol. 14, No. 20, XP002457693, pp. 9203-9210.

Fang et al, "Single Wavelength Silicon Evanescent Lasers", Communications and Photonics Conference and Exhibition, Nov. 2, 2009, pp. 1-2, XP031598800.

Roelkins et al, "Hybrid Silicon Lasers", Proceedings of SPIE, Jan. 26, 2011, vol. 7942.

Van Thourhout et al, "Nanophotonic devices for optical interconnect", IEEE Journal of Selected Topics in Quantum Electronics, Sep. 1, 2010, vol. 16, No. 5, pp. 1-13.

European Search Report for 10157111.5-2222, Aug. 13, 2010.

International Search Report and Written Opinion for PCT/EP2011/052773, Jul. 7, 2011.

International Preliminary Report on Patentability for PCT/EP2011/052773, Jul. 13, 2012.

European Office Action dated Nov. 13, 2013, for related application EP 11709349.2.

* cited by examiner (i)

(ii)

(i)

(ii)

LASER LIGHT COUPLING INTO SOI CMOS PHOTONIC INTEGRATED CIRCUIT

FIELD OF THE INVENTION

The invention relates to the field of optics. More particularly, the present invention relates to hybrid laser systems and corresponding methods for generating laser radiation.

BACKGROUND OF THE INVENTION

Silicon photonics has gained increased attention in recent years because of its potential to significantly reduce the cost of optical devices used in traditional applications and its potential to enable new applications. Silicon Photonic Integrated Circuits (PICs) can be fabricated using standard, wafer scale CMOS technology, allowing a drastic reduction of the cost of the integrated circuits through economies of scale. Moreover the high-end fabrication tools, also used for fabricating the most advanced electronic chips and capable of handling 200 mm or 300 mm silicon wafers, allow achieving high-yield fabrication and can bring volume economies to optics. Silicon is an ideal material platform for near-infrared and mid-infrared photonic integrated circuits. With a band gap of 1.12 eV, silicon is transparent for telecom wavelengths such as 1.3 μm and the 1.55 μm band. Moreover, using the silicon platform, integration of photonic devices with microelectronic circuits is enabled. Silicon photonics can enable a chip-scale platform for monolithic integration of photonics and micro-electronics for applications of optical interconnects in which high data bandwidths are required in a small footprint or applications such as chemical and biological sensors, or signal processing, where lower speed digital or analog functions may be required.

Many basic building blocks have been demonstrated in silicon photonics. High speed, 40 Gb/s, modulators, and photo-detectors have been demonstrated as well as passive devices such as multiplexers and demultiplexers, leading to high bandwidth silicon photonic chips. Electrically pumped lasers and optical amplifiers of a group IV element are not yet demonstrated. Various options have been suggested for such devices, one example being fiber coupling an external packaged laser to the silicon chip. This has an advantage in terms of thermal isolation but is not an integrated solution and so has a larger footprint. Furthermore, there is an important fiber coupling cost.

Individual laser dies also can be flip chip mounted to the optical wafer or might be transferred to the silicon platform using an epitaxial lift-off process. Tight mechanical alignment requirements make this option less attractive especially for wavelength division multiplexing (WDM) systems wherein the number of lasers required per chip for most applications has increased over the last years.

Alternatively, two different bonding approaches for achieving hybrid integration of III-V lasers with silicon-on-insulator (SOI) waveguides without need for stringent alignment in the assembly process have been published: molecular direct bonding and adhesive bonding. The advantage of such bonding approaches is that the alignment between III-V structures and silicon structures is achieved collectively through lithography. Furthermore, many lasers may be fabricated by bonding a single III-V die or wafer onto the silicon chip giving the possibility of fabricating arrays of multi-wavelength lasers integrated with other silicon photonic components suitable for WDM links. In the molecular direct bonding approach a strong bond between the different wafers/dies is realised by interfacial bonds. Adhesive bonding technology uses a glue, e.g. polymers or metals to realise wafer bonding.

At present some laser concepts have been enabled using heterogeneous integration. A first example of hybrid devices that have been reported are single and array micro disk lasers and FP lasers. The devices are all characterized by the fact that laser characteristics, e.g. laser wavelength, is defined by the III-V disk or ring or ridge. For these lasers, the in plane waveguide confinement and cavity confinement are performed in III-V materials.

A second example of hybrid devices provides in plane waveguide confinement and cavity confinement in silicon. In the second example, the device comprises a III-V epiwafer or die with a multiple quantum well region bonded prior to patterning the III-V into a photonic device, by means of a direct or adhesive bonding technology to the silicon platform. Patterns are defined in the silicon platform prior to the bonding process. These patterns might be essential parts of the laser cavity e.g. gratings, facets, tapers. Often, such a device is characterized by the fact that the optical mode is guided in the silicon waveguide. The optical mode of the silicon waveguide at least partially overlaps the III-V layer stack, realizing a confinement factor of about 5% with the multiple quantum well region (with typically 4 to 6 quantum wells). The optical mode obtains gain from the active region of the electrically pumped gain medium material while being guided by the optical waveguide in the passive semiconductor material or silicon waveguide. The silicon waveguide mode is evanescently amplified by the III-V epilayer, and such devices are as such called evanescent lasers. The cavity is formed by structures defined in the silicon platform, e.g. gratings, tapers, facets. The light is coupled out of the laser through one of these facets in the silicon passives. Different hybrid silicon-based evanescent devices are known e.g. Distributed Feedback Laser (DFB), Distributed Bragg Reflector laser (DBR), Mode-locked multi-wavelength laser, etc. Besides evanescent lasers, hybrid evanescent amplifiers, and/or detectors are known, all based on an evanescent overlap of the silicon waveguide mode with the III-V material. Hybrid silicon-based evanescent devices intrinsically have a low multiple quantum well confinement factor (order of 5%) by the fact that the optical mode is guided by the optical waveguide in the passive semiconductor material, e.g. silicon waveguide, and evanescently overlaps the active semiconductor material, e.g. III-V QW region. The confinement factor in the quantum wells is critical for determining how much gain/absorption is achievable. Once the gain from III-V active region is equal to the cavity and mirror loss, lasing is achieved. The low multiple quantum well confinement factor results in a moderate modal gain. This design choice targets minimal coupling losses from the laser section towards the adjoining optical network or circuit. The silicon confinement factor is an important parameter determining coupling efficiency with the adjoining optical network or circuit. To realize efficient coupling, a good confinement in the passive silicon waveguide is necessary (order 50-70%). Hybrid silicon evanescent lasers need to choose a compromise between silicon waveguide confinement and quantum well confinement.

There is still a need for efficient hybrid silicon photonics optical devices and/or hybrid silicon photonics optical devices operating at low overall power consumption.

SUMMARY OF THE INVENTION

It is an object of embodiments of the present invention to provide good hybrid lasers as well as methods for providing laser radiation using hybrid lasers.

It is an advantage of embodiments of the present invention that efficient hybrid lasers can be provided which can be made small in size. It is an advantage of at least some embodiments of the present invention that efficient hybrid lasers and/or hybrid lasers operating at low overall power consumption can be provided. It is an advantage of at least some embodiments of the present invention that efficient methods for providing laser radiation can be provided and/or methods for providing laser radiation at low power consumption.

The above objective is accomplished by a method and device according to the present invention.

It is an advantage of embodiments according to the present invention that parts, e.g. critical parts, of the laser cavity can be defined using CMOS technology. Such parts may be in the order of 100 nm to 200 nm and typically cannot or not accurately be made by optical lithography. Whereas in conventional systems e-beam lithography or holography is to be used, resulting in expensive and time consuming processes, embodiments of the present invention can make use of the more efficient CMOS technology. CMOS technology furthermore can provide a good yield when wavelength specific devices are needed as facet positioning and quarter wave sections can be more accurately defined.

It is an advantage of at least some embodiments that gratings can be defined in silicon, whereby no epitaxial regrowth is required. The process thus can be easier and more cost efficient compared to fabrication of non-hybrid lasers. Furthermore, as no additional integration with adjacent optical passive optical network, such as e.g. using a multiplexer, is required, the process is more cost efficient and requires a smaller footprint compared to non-hybrid lasers.

It is an advantage of at least some embodiments of the present invention that parts, e.g. critical parts of the laser cavity that for example determine the wavelength of the laser, can be made outside the optical active material, resulting in the possibility to better control the properties of the hybrid laser.

It is an advantage of at least some embodiments according to the present invention that they do not suffer from a low multiple quantum well confinement factor as the optical mode is mainly in the optical active material, e.g. the III-V quantum well region rather than in the optical passive waveguide and needing to be coupled evanescently to the optical active material. The latter results in the possibility of obtaining a higher gain or absorption compared to hybrid evanescent lasers.

The present invention relates to a hybrid laser for generating radiation, the hybrid laser comprising an optical passive material and an optical active material, the hybrid laser furthermore comprising a first optical waveguide and optical laser components defined in the optical passive material, the first optical waveguide being adapted for coupling out radiation from the hybrid laser, a second optical waveguide defined in the optical active material and the optical laser components comprising reflectors, the reflectors defining a cavity and being adapted for providing laser cavity confinement in the first optical waveguide and the second optical waveguide, wherein the second optical waveguide is positioned at least partly over the first optical waveguide so that an evanescent coupling interface is defined between the second optical waveguide and the first optical waveguide for coupling radiation from the second optical waveguide to the first optical waveguide, the evanescent coupling interface being positioned within the laser cavity. The hybrid laser is adapted for providing amplification of the radiation in the second optical waveguide.

It is an advantage of embodiments of the present invention that radiation outcoupling can be performed from the optical waveguide positioned in the optical passive material, resulting in an efficient hybrid laser.

It is an advantage of embodiments according to the present invention that the hybrid laser can be designed to enable a mode which couples from the active to the passive material, e.g. a III-V waveguide mode which couples to the first optical waveguide. It is an advantage of embodiments according to the present invention that an efficient hybrid laser is obtained. The passive material may be CMOS compatible or alike.

The first optical waveguide and the optical laser components may be defined in the optical passive material at distinct different positions. The evanescent coupling interface typically may couple a small fraction of the laser mode to the optical waveguide in the optical passive material in each pass. The reflectors may for example be any or a combination of Bragg grating reflectors, a mirror or a waveguide loop mirror. The reflector may be a Bragg grating reflector comprising a phase shifting section, whereby the phase shifting section may be selected such that at least for one wavelength, an enhanced cavity resonance is obtained.

It is an advantage of embodiments according to the present invention that the lasing wavelength for the hybrid lasers can be easily selected during manufacturing, without large implications on manufacturing and without large implications on the size of the hybrid laser. It is an advantage of embodiments according to the present invention that all patterns defining the laser cavity can be defined in the optical passive material, resulting in an easier manufacturing and more accurate hybrid laser, e.g. having a better defined wavelength.

The first optical waveguide and the second optical waveguide may lie within the laser cavity.

The hybrid laser may comprise current injection means for defining a current injection path in the second optical waveguide, whereby the second optical waveguide and the optical laser components are positioned such that the optical mode in the second optical waveguide and the current injection path overlap at least 5%. It is an advantage of embodiments according to the present invention that the hybrid laser is adapted for coupling from the III-V waveguide to the first optical waveguide within the laser cavity. The latter allows to obtain relatively low coupling losses.

The second optical waveguide may be a thin film waveguide. It is an advantage of embodiments according to the present invention that the second optical waveguide can be a thin film waveguide as this may allow a larger optical active gain material confinement, resulting in more efficient laser or in the possibility to create smaller devices.

The hybrid laser may comprise metal contacts for providing current injection and any of lateral oxidation, DBR stacks, gratings, indium tin oxide or proton implants may be implemented between the metal contacts and the second optical waveguide to avoid absorption of radiation in the metal contacts.

The second optical waveguide may be a straight waveguide. The second optical waveguide may be a curved waveguide. The second optical waveguide may be an open or closed ring waveguide or part thereof. It is an advantage of embodiments according to the present invention that, in contrast to existing ring lasers, the wavelength is predominantly defined by the optical laser components in the optical passive material, resulting in a high wavelength accuracy.

The second optical waveguide may be a fully or partially disc shaped waveguide or part thereof.

Metal contacts for current injection in the second optical waveguide may be positioned at the inner side of the curved waveguide, ring waveguide or part thereof or the disc waveguide or part thereof so that radiation is guided away from the contacts when the radiation travels in the curved waveguide, ring or disc.

A bonding layer may be present between the optical passive material and the optical active material.

The optical passive material may be one of the group of silicon, germanium, silicon germanium, silicon nitride, silicon carbide, silica or SOI. The substrate comprising an optical passive material may be a silicon on insulator substrate. It is an advantage of embodiments according to the present invention that use can be made of well known and widely available substrates or substrate technology such as SOI substrates.

The optical active material may be an optical active semiconductor material. It may be a III-V semiconductor material.

The hybrid laser may comprise a set of first waveguides and a set of optical laser elements so as to form a plurality of laser channels.

The hybrid laser may be part of an integrated photonic circuit. It is an advantage of embodiments according to the present invention that the hybrid laser can be easily used in an integrated photonic circuit. It is an advantage of embodiments according to the present invention that the integration of the hybrid laser in an integrated photonic circuit can result in a less complex and thus more accurate and cost effective packaging of the devices.

The integrated photonic circuit may comprise an array of hybrid lasers. It is an advantage of embodiments according to the present invention that a circuit with different lasers for different channels or with the possibility for wavelength selection can be provided. It is an advantage of embodiments of the present invention that an integrated circuit providing efficient radiation for different wavelengths or in a relatively broad wavelength region can be obtained.

The hybrid laser may be coupled to a multiplexer for multiplexing the wavelength in the first waveguide.

The integrated photonic circuit may be a silicon photonics circuit.

The present invention also relates to a photonics circuit, the circuit comprising a hybrid laser as described above. The photonics circuit also may comprise a multiplexer and the multiplexer and hybrid laser may be coupled. The photonics circuit also may comprise an array of lasers, so that e.g. a photonics circuit is obtained allowing selection between a plurality of different radiation wavelengths or e.g. a photonic circuit is obtained with a plurality of channels, each channel comprising at least one hybrid laser. The photonic integrated circuit may be a silicon photonic integrated circuit.

The optical laser components may comprise modal-asymmetric cavity reflectors.

The present invention also relates to the use of a hybrid laser as described above for generating an optical link, for spectroscopy, for biosensing, for imaging or other. It is an advantage of embodiments according to the present invention that such applications can benefit from wavelength stability, single mode laser operation and efficiency of the hybrid photonics laser.

The present invention also relates to a method for making a hybrid laser, the method comprising obtaining a substrate comprising an optical passive material, defining a first optical waveguide adapted for coupling out radiation from the hybrid laser and optical laser components in the optical passive material, the laser components comprising reflectors defining a cavity, obtaining an optical active material on the substrate defining a second optical waveguide in the optical active material so that an evanescent coupling interface is formed between the first optical waveguide and the second optical waveguide for coupling radiation from the second optical waveguide to the first optical waveguide. The reflectors are adapted for providing laser cavity confinement in the first optical waveguide and the second optical waveguide. The evanescent coupling interface is positioned within the laser cavity. The first optical waveguide and the second optical waveguide also may be positioned within the laser cavity. It is an advantage of embodiments according to the present invention that the optical laser components can be made in the optical passive material, as this results in the properties of the laser being more accurately defined. It furthermore is an advantage that by selecting a particular configuration for the different components, e.g. the passive material, the active material and the bonding layer, the optical mode will be better confined in the second optical waveguide, resulting in a more efficient hybrid laser. Obtaining a substrate comprising an optical passive material may encompass both the manufacturing of such a substrate by providing an optical passive material thereon or obtaining a previously made substrate such as for example an SOI substrate.

Obtaining an optical active material on the substrate may comprise obtaining a second substrate provided with an optical active material, bonding the second substrate provided with the optical active material to the substrate comprising an optical passive material, and removing the second substrate. It is an advantage of embodiments according to the present invention that efficient and widespread techniques such as bonding can be used for combining the optical passive material and the optical active material.

Defining a first optical waveguide and optical laser components may comprise defining a first optical waveguide and optical laser components at distinct different positions in the optical passive material.

The method furthermore may comprise providing contacts on the optical active material for creating a current injection path.

The method may comprise processing the first substrate to introduce further components to generate an integrated photonic circuit, thus generating an integrated photonics circuit with embedded hybrid laser. It is an advantage of embodiments of the present invention that the hybrid laser can be part of an integrated photonic circuit and that processing can be done during the same or similar processing steps.

The method furthermore may comprise packaging the integrated photonic circuit with embedded hybrid laser in a single packaging. It is an advantage of embodiments according to the present invention that less complex and thus more accurate and more efficient packaging of chips using hybrid lasers can be obtained.

Defining a first optical waveguide and optical laser components may comprise defining a set of first optical waveguides and a set of optical laser components so as to create an array of lasers. It is an advantage of embodiments according to the present invention that an array of lasers or a multi-wavelength laser can be made in a single processing cycle.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION OF ILLUSTRATIVE EMBODIMENTS

Figure 1:
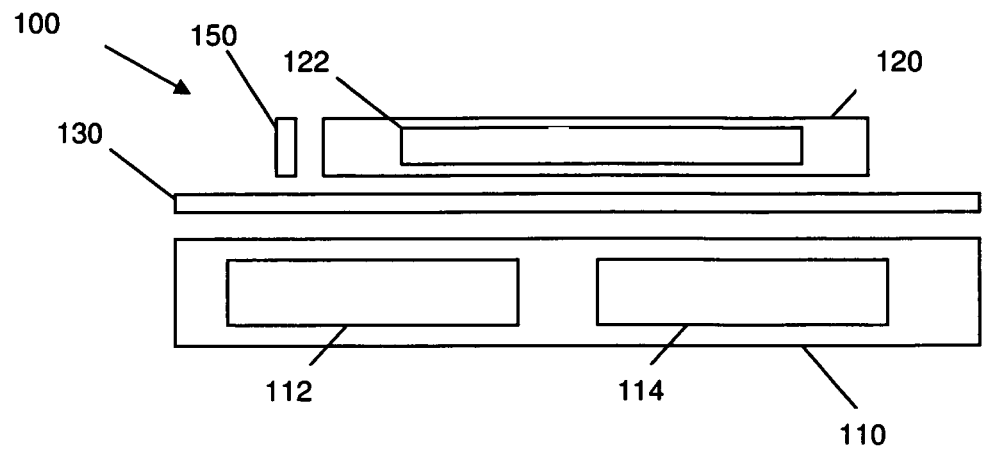
FIG. 1 illustrates a schematic representation of a hybrid laser according to an embodiment of the present invention FIG. 2A, FIG. 2B.

Whereas in embodiments illustrating the devices and methods of the present invention often reference is made to a silicon on insulator (SOI) material system in combination with a III-V optical active material, embodiments of the present invention are not limited thereto and relate to use of a high index contrast optical passive material, such as for example an SOI material system, silicon, germanium, silicon germanium, silicon nitride, silicon carbide, etc. in combination with use of an optical active material, e.g. an optical active semiconductor material. The optical passive material and optical active material may be single materials or a combination of materials, such as for example a stack of materials. Silicon-on-Insulator, nevertheless is a very interesting material system for highly integrated photonic circuits. The high refractive index contrast allows photonic waveguides and waveguide components with submicron dimensions to guide, bend and control light on a very small scale so that various functions can be integrated on a chip. Such waveguides allow a high level of miniaturization, which is advantageous. Furthermore for such waveguide types radiation can be efficiently coupled in and out the photonics integrated circuit. Using Silicon-on-insulator also has some technological advantages. Due to the CMOS industry, silicon technology has reached a level of maturity that outperforms any other planar chip manufacturing technique by several orders of magnitude in terms of performance, reproducibility and throughput. Nano-photonic ICs can be fabricated with wafer scale-processes, which means that a wafer can contain a large number of photonic integrated circuits. Combined with the commercial availability of large wafers at a relative moderate cost, this means that the price per photonic integrated circuit can be very low.

Where in embodiments of the present invention reference is made to an optical passive material, reference is made to an optical material, substantially transparent at the wavelength or in the wavelength region where the laser will produce radiation. The optical passive material may encompass for example any of the group of silicon (Si), germanium (Ge), silicon germanium (SiGe), silicon nitride ($SiN_x$), silicon carbide (SiC) and silicon oxide (SiOx). The optical passive material may be a CMOS compatible material, i.e. a material that can be processed using CMOS technology. It may be a stack of materials.

Where in embodiments of the present invention reference is made to radiation, reference is made to electromagnetic radiation. The radiation envisaged is in principle not limited and may be any useful wavelength or wavelength range for applications envisaged. Some examples of radiation ranges that are envisaged, embodiments of the present invention not being limited thereto, are visual radiation, infrared radiation, near infrared radiation and mid infrared radiation.

Where in embodiments of the present invention reference is made to thin film optical active material, reference is made to films having a thickness advantageously being lower than 2 micron. More particularly, where reference is made to thin films, reference may be made to films having a thickness between 50 nm and 2 micron.

Where in embodiments according to the present invention reference is made to a reflector, reference is made to a structure that reflects a forward propagating guided mode into the same (or a different) backward guided mode.

According to a first aspect, the present invention relates to a hybrid photonic laser for generating laser radiation. The hybrid photonic laser according to at least some embodiments of the present invention addresses the intrinsic compromise between optical active semiconductor material confinement and silicon waveguide confinement to be made in the hybrid lasers currently available. The hybrid laser according to embodiments of the present invention comprises an optical passive material and an optical active material. The laser comprises a first optical waveguide defined in the optical passive material and adapted for guiding radiation out of the hybrid laser. The first optical waveguide also can be referred to as optical passive waveguide. The first optical waveguide will provide for efficient outcoupling of the radiation. The hybrid laser also comprises optical laser components defined in the optical passive material, for example at distinct different positions in the optical passive material. The optical passive material may be an optical passive semiconductor material such as for example silicon, germanium, silicon germanium or silicon carbide although the invention is not limited thereto and e.g. silicon nitride or silicon oxide also may be used. The optical laser components comprise reflectors defining the laser cavity and being adapted, e.g. in structure and/or position, for providing laser cavity confinement. The hybrid laser also comprises a second optical waveguide defined in the optical active material. The optical active material may be optical active semiconductor material. The second optical waveguide also may be referred to as active optical waveguide. The second optical waveguide may be provided by one or more active quantum wells. The second optical waveguide may be in the shape of a straight waveguide, in the shape of a curved waveguide, in the shape of a ring waveguide, in the shape of a disc waveguide, or in any other suitable shape. The second optical waveguide thereby is positioned at least partly over the first optical waveguide so that an evanescent coupling interface is defined between the second optical waveguide and the first optical waveguide for coupling radiation from the second optical waveguide to the first optical waveguide. The evanescent coupling interface is positioned in the laser cavity. The reflectors may provide laser cavity confinement in the first and second optical waveguide. Also the first optical waveguide and the second optical waveguide typically may be positioned in the cavity. Thus evanescent coupling happens within the laser cavity and can be efficient such that losses due to coupling to unwanted radiation modes or unwanted guided modes are minimal. The optical mode in the first optical waveguide, that is evanescently excited by the optical mode guided by the optical active waveguide, will couple or be guided with low loss to the adjoining optical network or circuit.

The second optical waveguide according to embodiments of the present invention may be positioned over the optical laser components. In some embodiments of the present invention, coupling out radiation directly from within the laser cavity using the first optical waveguide is advantageously obtained by separating the optical laser components and the first optical waveguide from each other in the optical passive material, i.e. by positioning them at distinct different positions. The second optical waveguide overlaps at least partly with the first optical waveguide and with the optical laser components. The optical laser components in embodiments of the present invention thereby provide a laser cavity feedback mechanism. Such optical laser components may for example be patterns, e.g. gratings, tapers, mirrors, with which the optical mode guided by the optical active waveguide overlaps. In some embodiments, such optical laser components may be loop mirrors. The overlap fraction of the optical mode guided by the optical active waveguide and the optical laser components will determine the efficiency, e.g. reflectivity, of the components. The control of the thickness of intermediate layers between the optical active material and the optical passive material can in some embodiments be used to maximize this efficiency. Other components, such as for example electrical contacts for generating electrically pumped laser operation in the optical active gain material also are provided.

It is an advantage of embodiments according to the present invention that the optical mode of the laser is guided in the optical active waveguide. The latter may allow for a high gain. It is an advantage of embodiments according to the present invention that the hybrid laser combines optimal optical active gain material confinement and optimal excitation of the optical mode in the adjoining network or circuit; or equivalently combines high gain with low coupling losses. This is translated in a low threshold current and thus less thermal dissipation at the same nominal output power and a higher differential efficiency. Minimization of thermal dissipation is extremely important in dense multiwavelength applications or to enable uncooled operation at typical ambient temperatures. In comparison with non-hybrid integrated lasers, e.g. lasers defined in optical active material only, defining parts of the laser cavity, e.g. gratings, in the optical passive material enables the use of a CMOS compatible material and thus of CMOS compatible technology for manufacturing of parts of the laser cavity. While at the same time providing optical active/passive integration, using CMOS technology to define critical features of the laser such as mirrors or gratings improves thoroughly accuracy, robustness and decreases cost at moderate to high volume. By way of illustration, FIG. 1 shows a schematic representation of the different components of a hybrid laser. In FIG. 1, the hybrid laser 100 is shown comprising the optical passive material 110, the optical active material 120, the first optical waveguide 112 defined in the optical passive material 110, the optical laser components 114 also positioned in the optical passive material 110 but at a distinct different position and the second optical waveguide 122 defined in the optical active material 120. The evanescent coupling interface 130 and the electrical contacts 140 for electrically pumping also are indicated schematically.

It is an advantage of embodiments according to the present invention that the waveguide cross-sections and optical laser components are designed to enable an optical active waveguide mode that evanescently couples to the waveguide in the optical passive material.

It is an advantage of embodiments according to the present invention that the coupling of the radiation from the optical active waveguide to the waveguide in the optical passive material occurs within the laser cavity.

It is an advantage of embodiments according to the present invention that the optical laser components defining the laser cavity are defined in the optical passive material.

Figure 2A:
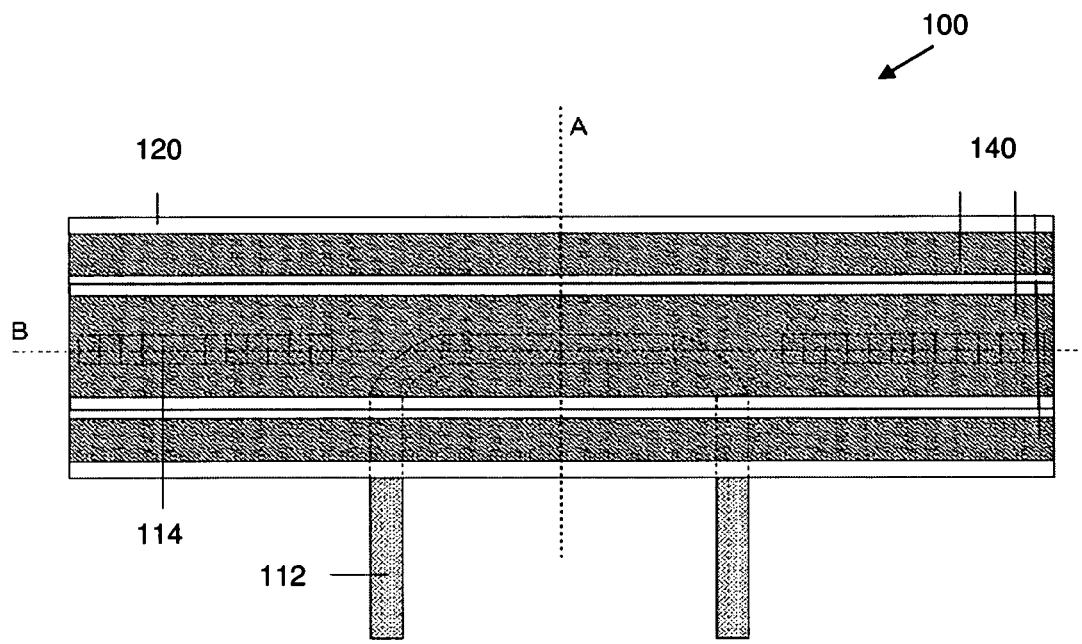
FIG. 2C illustrates a top view respectively two cross sections of an example of an electrically pumped hybrid laser having a straight waveguide according to a particular embodiment of the present invention.
Figure 2B:
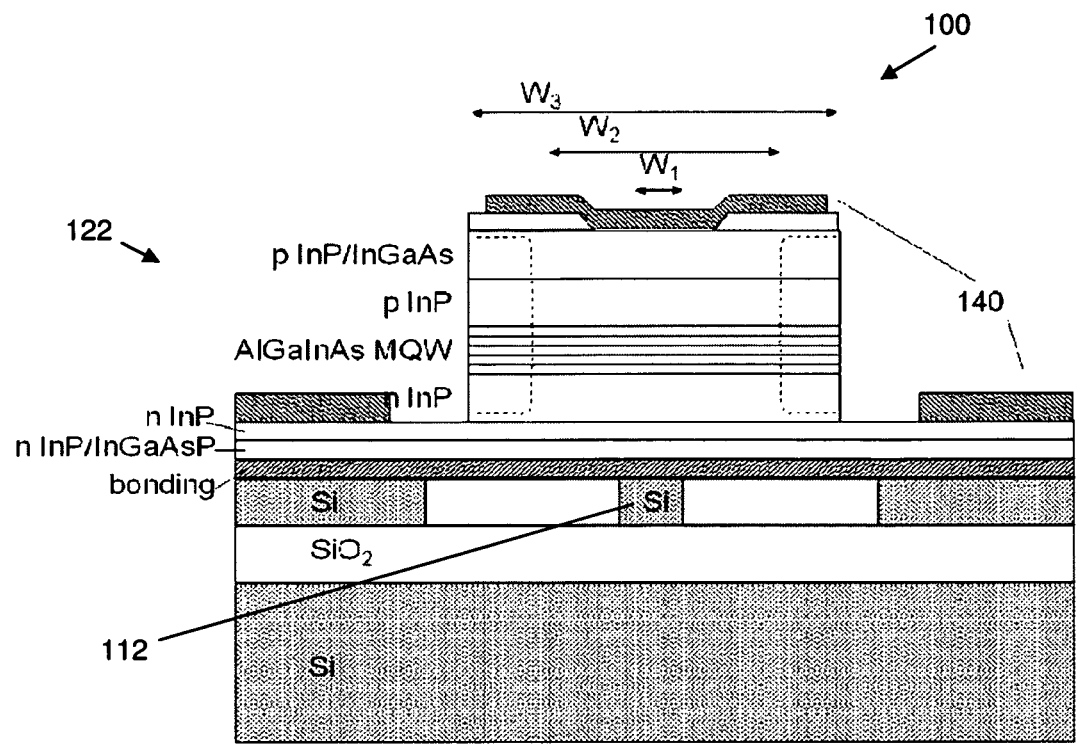
Figure 2C:
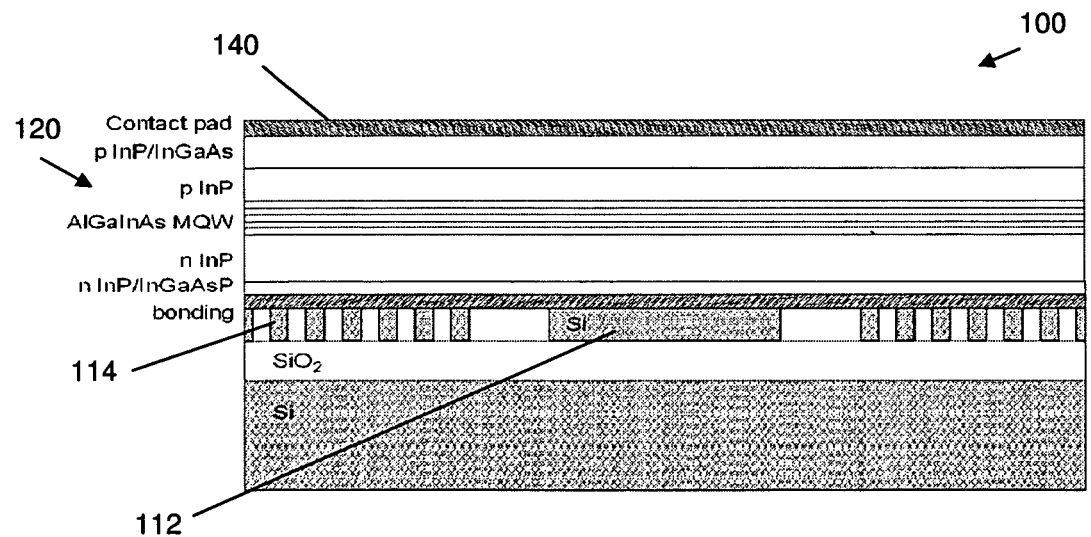
Figure 3A:
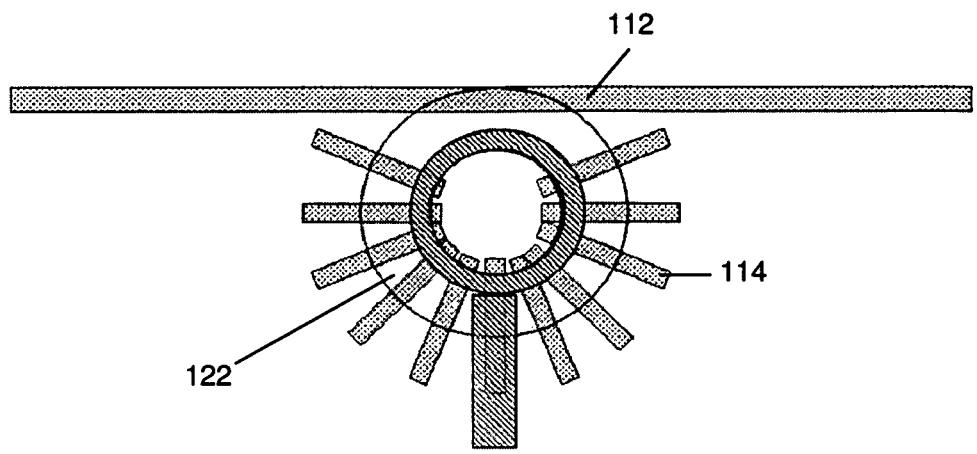
FIG. 3A illustrate a top view of electrically pumped hybrid lasers having a ring waveguide with cavity mirrors made by different respectively the same patterns, according to particular embodiments of the present invention.
Figure 3B:
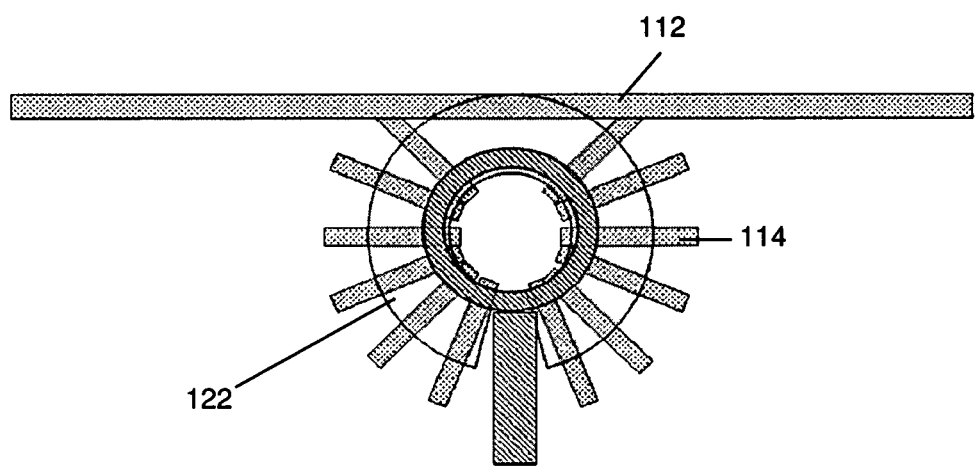
FIG. 3B and FIG. 3C illustrates a top view of electrically pumped hybrid lasers having a curved, non-closed waveguide with cavity mirrors according to a particular embodiment of the present invention.
Figure 3C:
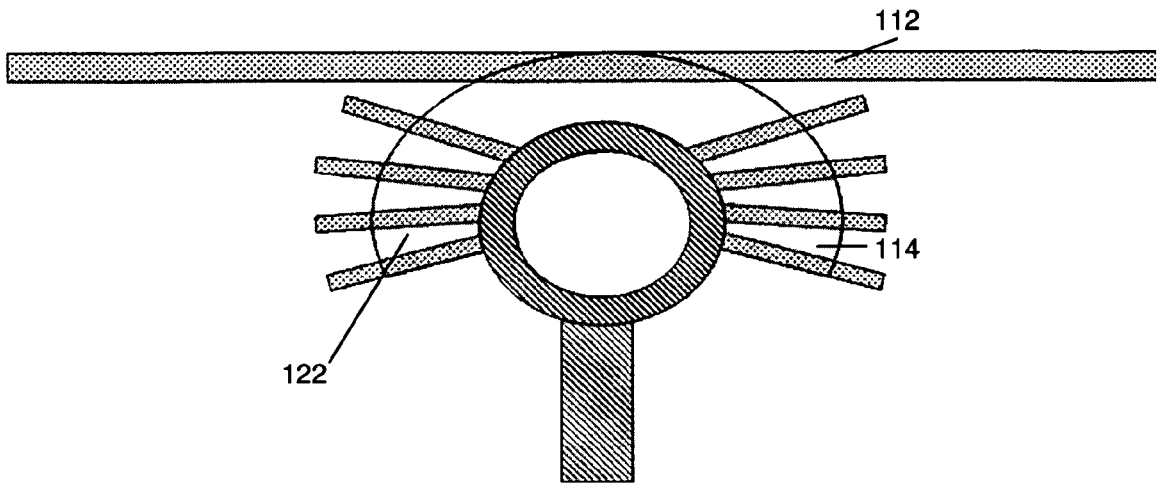
Figure 4A:
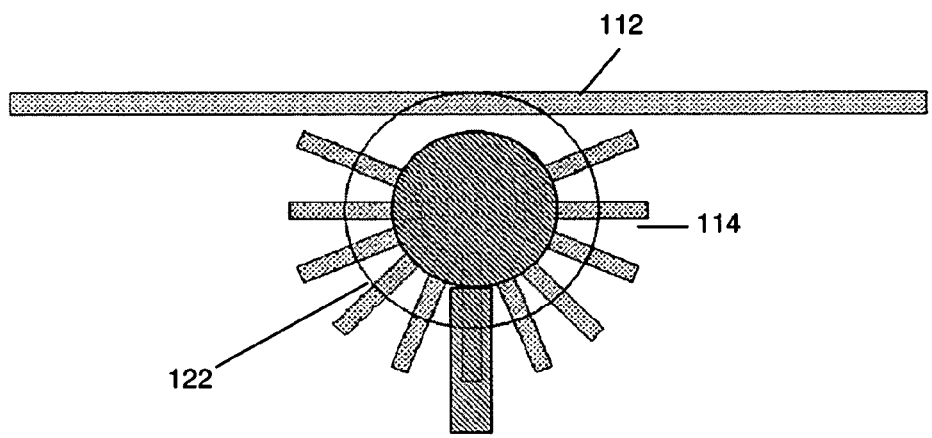
FIG. 4A and FIG. 4B illustrates a top view of electrically pumped hybrid lasers having a disc shaped waveguide with cavity mirrors made by different respectively the same patterns, according to a particular embodiment of the present invention.
Figure 4B:
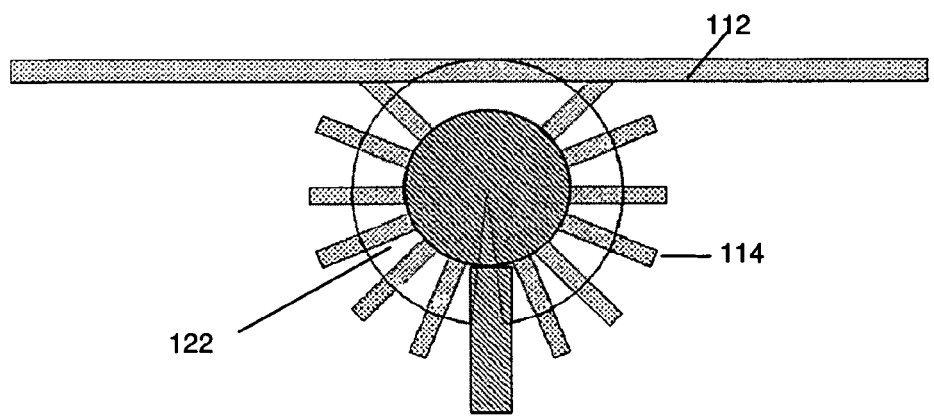

To illustrate further features and advantages of the new design FIG. 2A to FIG. 2C is showing generally an example of an electrically pumped hybrid silicon laser, in the embodiment of a straight waveguide, FIG. 3A is showing generally an example of an electrically pumped hybrid silicon laser, in the embodiment of a ring waveguide and FIG. 4A to FIG. 4B is showing generally an example of an electrically pumped hybrid silicon laser, in the embodiment of a disk waveguide. Alternative embodiments, such as for example curved waveguides (e.g. a non-fully closed ring waveguide) also could be used and an example thereof is illustrated in FIG. 3B and FIG. 3C. For means of simplicity, the structure is described by means of the embodiment shown in FIG. 2A, FIG. 2B and FIG. 2C, i.e. the straight waveguide embodiment. The principle is nevertheless not limited to straight waveguides, and conceptually equal for other embodiments like microdisk and ring waveguides or curved waveguides.

The laser shown in FIG. 2A to FIG. 2C is showing generally an example of an electrically pumped hybrid laser 100, in the present example being a hybrid silicon laser. The hybrid laser includes an optical waveguide 122, also referred to as second optical waveguide 122, defined in optical active gain medium material 120. It also includes an optical waveguide 112, also referred to as first optical waveguide 112, defined in optical passive material 110. The hybrid laser furthermore comprises optical laser components 114, e.g. optical patterns, defined in the optical passive material 110, also referred to as optical passive material. Furthermore the laser may comprise electrical contacts 140 for defining a current injection path defined through the optical active material 120. Depending on the way of bonding the optical active gain medium material 120 to the optical passive medium material 110, e.g. direct wafer bonding or adhesive bonding or flip-chip bonding, a bonding layer 150 may be present in between the optical active gain medium material 120 and the optical passive material 110. FIG. 2A illustrates a top view of the device 100, while FIG. 2B and FIG. 2C illustrate the cross sections A and B indicated in FIG. 2A respectively. The optical active waveguide 122 is disposed over the partly adjacent first optical waveguide 112 and the optical laser components 124. The optical mode guided by the optical active waveguide 122 evanescently couples to the adjacent first optical waveguide 112 and overlaps the optical laser components 114. The first optical waveguide 112 guides the optical laser beam without extra insertion losses towards the adjoining optical network or circuit. In embodiments of the present invention, the optical active material can be a thick layer (order dimensions 2-5 micron) or a thin layer (order dimensions 50 nm-2 micron). In thin-film optical active waveguides (straight, ring, disk or other), the optical mode guided by the optical active waveguide 122 is overlapping the optical passive material 110 much stronger. The reflectivity realized by the optical laser components will be larger, enabling more efficient and thus shorter devices. In some examples, embodiments of the present invention not being limited thereby, the length of the hybrid laser may for example be in the order of 50-150 micron cavity length. Small active volume lasers result in a higher relaxation oscillation frequency enabling higher modulation speeds. As lower injection current is needed to bring the laser in lasing mode, small active volume lasers enable a lower threshold current and as such a higher efficiency.

However, using thin-film waveguides, precautions have to be taken towards the proximity of metallic contact pads which are typically residing on the top of the active optical waveguide 122. Due to the overlap of the optical mode profile with the electrical contact pad, absorption losses in the metal may occur. An option is to use side contact pads in combination with lateral oxidation to force the light and the current to be both at the center of the waveguide ridge. Other options using gratings, proton implants, lateral oxidation, optically transparent electrodes like indium tin oxide (ITO) etc. exist to keep the light away from the metal or minimize the absorption, but retaining coincidence of the light and the current injection at the optical active material. A very elegant approach in the case of this new hybrid laser concept, is the use of a curved or ring waveguide, pushing the light away from the electrical contact pads. This approach is detailed in the description of a second embodiment as depicted FIG. 3A. In one particular example of an embodiment as shown in FIG. 2A, typical dimensions of the optical active waveguide being a III-V waveguide may be a thickness in the range 50 nm-5 micron, a width of electrically injected section between 0.5-5 micron, an optical passive waveguide being a silicon waveguide having a thickness in the order of 200 to 4000 nm and a width in the range of 200 nm to 4000 nm. The optical laser components are silicon patterns being gratings as required for the wavelength used e.g. with a grating period in the order of half of the wavelength in the material, a length of the grating section of 50-300 micron and a length of a coupler in the order of 100 nm to 20 micron. A bond layer, if any can be in the range 10-200 nm, e.g. in the range 30 nm to 80 nm.

FIG. 3A, is showing generally an example of an electrically pumped hybrid laser 100, in the embodiment of a ring waveguide 122, i.e. including a waveguide ring 122 defined in optical active gain medium material 120. The laser 100 comprises a first optical waveguide 112 defined in the optical passive material 110. In this material, also optical laser components 114, e.g. optical patterns, are defined. The laser furthermore comprises electrical contacts 140 for defining a current injection path defined through the optical active material 120. Depending on the way of bonding the optical active gain material 120 to the optical passive material 110, e.g. direct wafer bonding or adhesive bonding or flip-chip bonding, a bonding layer 150 is included in between the optical active gain medium material 120 and the optical passive material 110. The optical active waveguide 122 is disposed over the partly adjacent first optical waveguide 112 in the optical passive material 110 and over the optical laser components 114. The optical waveguide mode in the optical active waveguide 122 evanescently couples to the partly adjacent first optical waveguide 112 and overlaps the optical laser components 114. Contrary to state of the art ring lasers, in this new concept the wavelength is predominantly defined by the optical laser components 114 in the optical passive material. This results in a drastic improvement of wavelength accuracy in embodiments of the present invention. The first optical waveguide 112 guides the optical laser beam without extra insertion losses towards the adjacent optical network or circuit.

In the embodiment of FIG. 3A, both cavity mirrors are implemented separately and are not shared. This embodiment is very similar to the embodiment of FIG. 2A, although the waveguide is curved. Using a curved waveguide is beneficial when using thin-film III-V material with thicknesses in the order of 50 nm-2000 nm. The nature of curved waveguides or bends, forces the light to the edge of the waveguide. The electrical current path can now be realized by an opposite electrical contact on the top of the ridge. This is depicted in FIG. 3A. This thin film approach combines high multiple quantum confinement, high facet reflection, low cavity losses and low coupling losses. Furthermore, as indicated above, the wavelength of the radiation produced by the hybrid laser is significantly improved compared to state of the art ring lasers.

In the embodiment of FIG. 3B, both cavity mirrors are realized by the same grating section. This embodiment is very similar to the embodiment of FIG. 3A, however by assembling the cavity mirrors, a smaller diameter can be realized and the embodiment shown in FIG. 3B results in a not fully closed ring waveguide. In FIG. 3C a curved waveguide is shown similar as in FIG. 3A and FIG. 3B but wherein the curved waveguide is a non-fully closed ring waveguide.

FIG. 4A is showing generally an example of an electrically pumped hybrid silicon laser, in the embodiment of a disk waveguide, including a disk shaped waveguide defined in the optical active gain medium material. Furthermore similar features are provided as described for the laser embodiment with the ring shaped waveguide. The optical whispering gallery mode in the optical active waveguide 122 evanescently couples to the partly adjacent first optical waveguide 112 and overlaps the optical laser components 114. In contrary to state of the art disk lasers, in this new concept the wavelength is predominantly defined by the optical laser components in the optical passive material. This results in a drastic improvement of wavelength accuracy in embodiments of the present invention. The optical waveguide defined in the optical passive material guides the optical laser beam without extra insertion losses towards the adjacent optical network or circuit. Similar to the embodiment of the ring laser or partial ring lasers as depicted in FIG. 3A, FIG. 3B and FIG. 3C, the cavity mirrors in the optical passive material, in the present example being silicon, can be realized as separate pattern sections or can be realized as a single pattern section, as shown in FIG. 4A and FIG. 4B respectively.

For clarity reasons, the gratings shown in FIG. 3A, FIG. 3B and FIG. 3C and in FIG. 4A and FIG. 4B are not drawn in proportion with respect to the ring or disc waveguides and the first waveguide.

By way of illustration, embodiments of the present invention not being limited thereto, a number of exemplary embodiments is illustrated below.

In the first two exemplary embodiments, the confinement in a hybrid laser is discussed, with reference to FIG. 5A to FIG. 5D and to FIG. 6A to FIG. 6D. Whereas a particular example is discussed for a hybrid laser with particular materials selected, embodiments of the present invention are not limited thereby and the features and advantages shown also apply to other embodiments of the present invention.

Figure 5A:
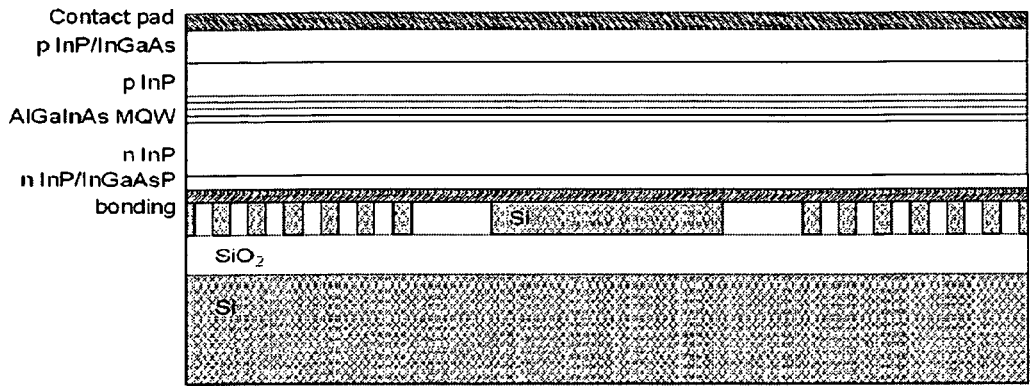
FIG. 5A to FIG. 5D illustrate simulated results for a particular example of a hybrid laser, the corresponding modal distribution, the influence of the bonding layer on the confinement of radiation in the optical active material, the impact on the reflection strength of the grating, illustrating features as can be obtained according to a particular embodiment of the present invention.
Figure 5B:
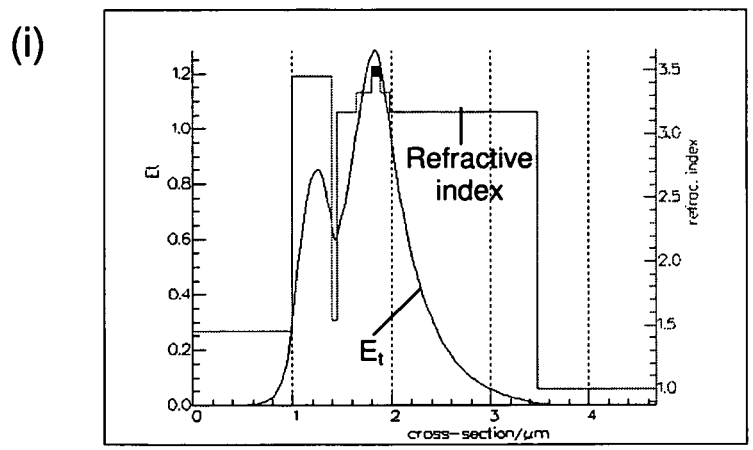
Figure 5B:
Figure 5C:
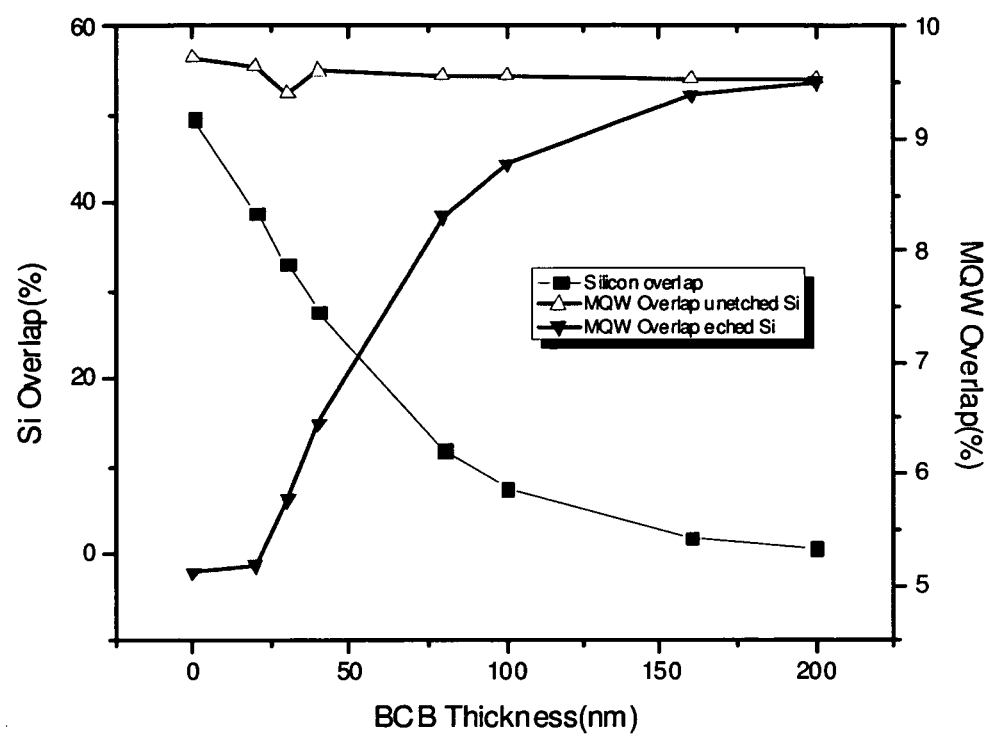

FIG. 5A demonstrates a cross section (FIG. 5A part) of a divinylsiloxane-benzocyclobutene DVS-BCB bonded III-V epilayer on a patterned silicon waveguide, together with table 1 showing example compositions, doping concentrations, and thickness of individual layers of a III-V portion of a hybrid device in accordance with one or more embodiments of this invention. As indicated, it should be noted that the table is merely one example of how a III-V wafer of the hybrid laser could be fabricated and other compositions, doping concentrations and or thicknesses may likewise be used, in addition to more or fewer layers of structures in various arrangements. The scope of the invention is not limited in these respects. The modal distribution of the structure is depicted in FIG. 5B, along a cross-section through the gain and passive material (i) and in a 2D representation (ii). It is clear that the design enables large overlap of the optical mode with the gain section of the optical active material, while the tail of the optical mode overlaps the optical passive material and the optical laser components or waveguide therein. The degree of overlap will depend on the presence and thickness of intermediate layers between the optical active material and the optical passive material, and the waveguide parameters. In case of direct bonding, the thickness of the intermediate layer is essentially zero, in case of adhesive bonding, the effective distance is determined by the adhesive layer. The influence of e.g. a DVS-BCB bonding layer on the confinement of the light in the MQW layer and on the overlap with the silicon is depicted in FIG. 5C for the specific configuration as depicted in FIG. 5A. The percentage of silicon overlap and MQW well overlap percentages are represented on the vertical axis versus thickness of bonding layer in nanometers on the horizontal axis. The plots are generated using simulations. The plots show that for the specific configuration as depicted in FIG. 5A a BCB layer of thickness up to 80 nm or so may be utilized without affecting the performance of the hybrid laser to allow the fabrication of a laser or similar device with greater than about 5% optical active gain confinement factor for and silicon overlap greater than 10%. The large optical active gain confinement factor enables high gain, to achieve lasing at low threshold currents or smaller devices. The silicon pattern overlap of 10% or so may be sufficient to achieve low loss coupling of laser light in this or other embodiments. The silicon overlap has a predominant impact on the reflection strength of the grating, which is depicted in FIG. 5D.

Figure 5D:
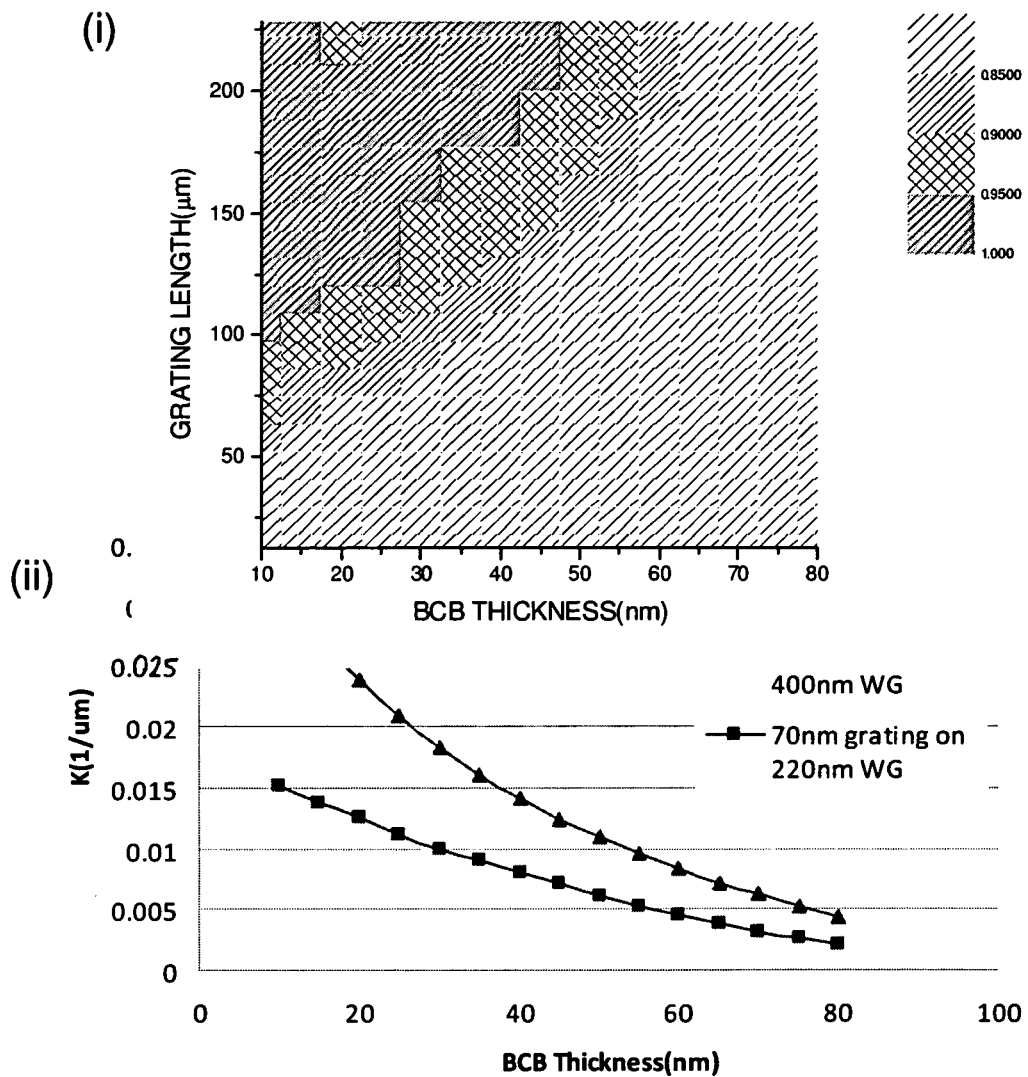

Referring to FIG. 5D, the reflection strength of different grating patterns is simulated for the specific embodiment depicted in FIG. 5A. The horizontal axis represents the number of periods, the vertical axis presents the BCB layer thickness, the curves denote the reflectivity which is attained for the respective combination of number of periods and BCB layer thickness. For reasons of generality, the reflective behavior is depicted for different silicon waveguide thicknesses and different etch depths. The plot show that grating strength of kappa>0.005 can be obtained to enable lasing. It is important to note that these examples are to demonstrate operationability of the concept. Whereas in FIG. 5D (i) simulations are shown as function of the grating length, in FIG. 5D (ii) simulations are shown as function of kappa. The simulations do not represent optimal working conditions.

It is important to note that the data in FIG. 5A to FIG. 5D represent merely one example arrangement of the invented hybrid laser and the scope of embodiments of the present invention should not be limited to this example.

Figure 6A:
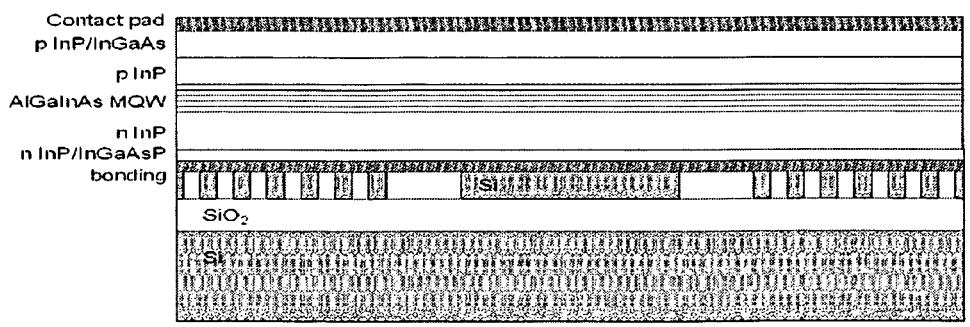
FIG. 6A to FIG. 6D illustrate simulated results for a particular example of a hybrid laser using a thin film optical active material, the corresponding modal distribution, the influence of the bonding layer on the confinement of radiation in the optical active material, the impact on the reflection strength of the grating, illustrating features as can be obtained according to a particular embodiment of the present invention.
Figure 6B:
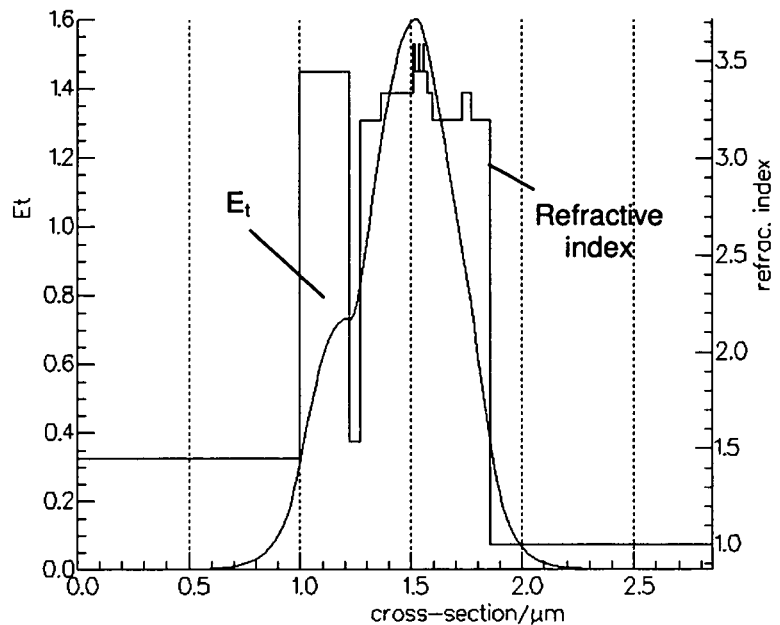
Figure 6B:
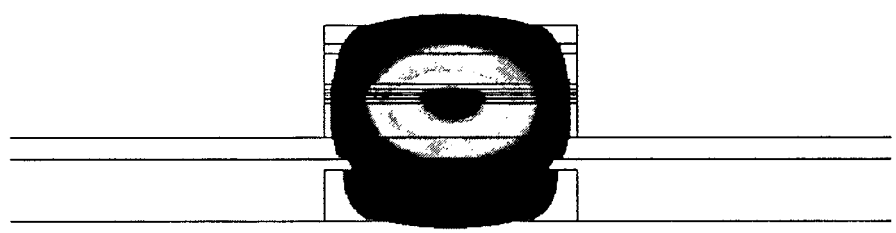
Figure 6C:
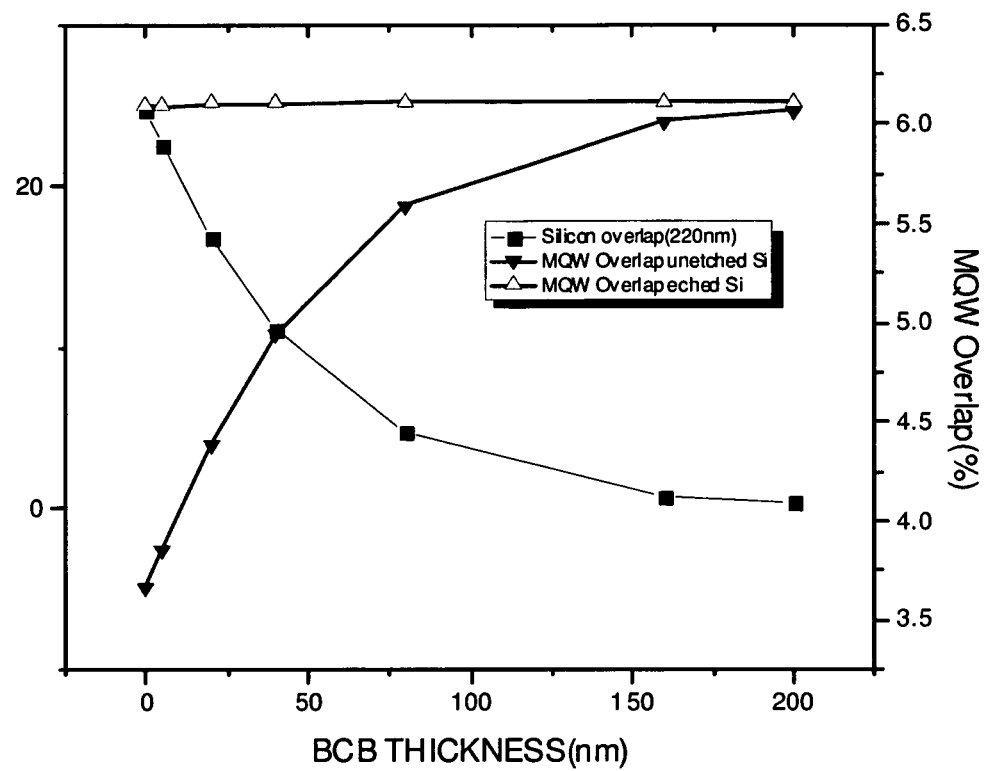
Figure 6D:
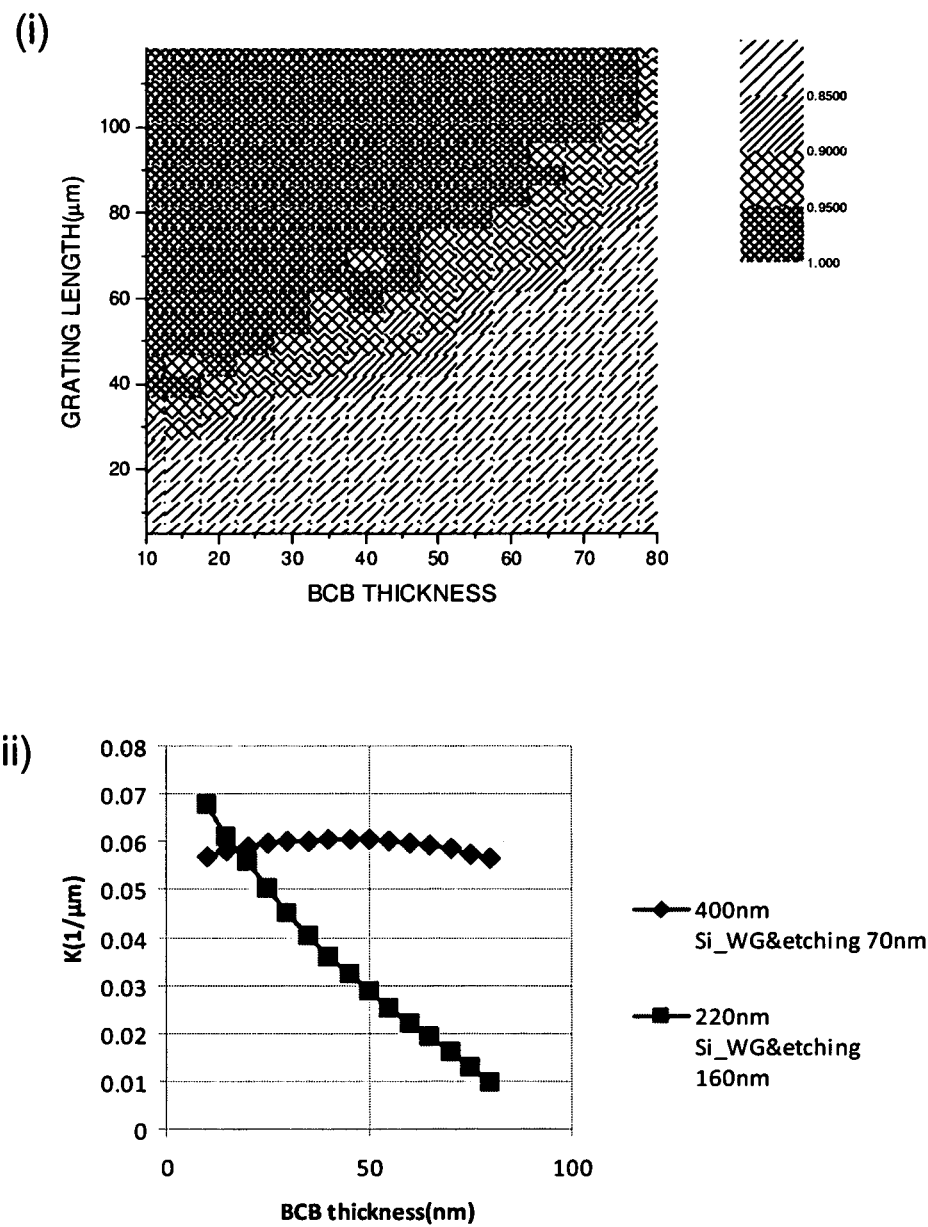

Although the overlap of the optical mode guided by the optical active material with the optical laser components, and this the grating strength expressed by kappa, is sufficient to enable lasing, obtaining a laser with sufficient efficiency for some applications requires a rather long device. A shorter implementation of the new hybrid laser can be realized by using a thin-film optical active material. Using a thin-film optical active material, for which an example embodiment is defined by the thickness values given in the table 2 corresponding with FIG. 6A, the overlap of the optical mode with the optical laser components will be enhanced. The modal distribution of the guided mode in the hybrid laser for which the III-V portion is a thin film, is shown in FIG. 6B for the specific case as depicted in table 2, whereby the modal distribution is shown for a cross section in FIG. 6B (i) and in 2-dimensions for FIG. 6B (ii). Mind the fact that the number of QWs in FIG. 6 is lower half the number of QWs in FIG. 5. The influence of e.g. a DVS-BCB bonding layer on the confinement of the light in the optical active gain material and on the overlap with the optical passive material is depicted in FIG. 6C for the specific configuration as depicted in FIG. 6A. The percentage of overlap with the optical passive material and the percentage of optical active gain material overlap are represented on the vertical axis versus thickness of a bonding layer in nanometers on the horizontal axis. The plots are generated using simulations. The plots show that for the specific configuration as depicted in FIG. 6A and table 2 a BCB layer of thicknesses up to 70 nm or so may be utilized without affecting the performance of the hybrid laser to allow the fabrication of a laser or similar device with large optical active gain material confinement factor and optical passive material overlap. The large optical active gain material confinement factor enables high gain, to achieve lasing at low threshold currents or smaller devices. The optical passive material overlap per unit thickness active material is clearly higher in the case of a thin-film III-V optical active material. Referring to FIG. 6D, the reflection strength of different grating patterns is simulated for the specific embodiment depicted in FIG. 6A and table 2 in FIG. 6D (i) shown as function of the grating length and in FIG. 6D (ii) as function of kappa. The horizontal axis represents the number of periods, the vertical axe presents the BCB layer thickness, the curves denote the reflectivity which is attained for the respective combination of number of periods and BCB layer thickness. For reasons of generality, the reflective behavior is depicted for different optical passive waveguide thicknesses and different etch depths. The plot shows that high reflectivity can be obtained to enable lasing, and this with a much shorter grating pattern when using a thin-film optical active material. It is important to note that these examples are to demonstrate operationability of the concept. The simulations do not represent optimal working conditions.

It is important to realize that for embodiments in which the optical active material portion is a thin-film, the absorption losses of the laser light in the nearby electric contact might be substantial. These absorption losses predominantly limit the differential efficiency of the laser. As discussed above, several precautions can be integrated in the design of the laser to minimize these losses, while preserving an optimal current path. These precautions might be lateral oxidation, proton-implant, vertical junctions, gratings, etc. Alternatively, this new laser concept permits to perform the lasing action in a ring or disk configuration, as discussed above. In a ring laser, the laser radiation is confined near the edge of the ridge waveguide. The top contact pad can be deposited on the ridge at the opponent edge of the ridge. In a disk laser, the whispering gallery mode is confined at the edge of the disk. The contact pad can be deposited on the center of the disk. As indicated above, the data in FIG. 6A to FIG. 6D represent merely one example arrangement of the invented hybrid laser and the scope of the invention is not limited in this respect.

In some exemplary embodiments the overlap of the optical mode guided by the optical active material with the optical laser components is sufficient to enable lasing, obtaining a laser with sufficient efficiency for some applications requires a rather long device. A shorter implementation of the new hybrid laser can be realized by using a thin-film optical active material. Using a thin-film optical active material, the overlap of the optical mode with the optical laser components will be enhanced.

It is important to realize that for embodiments in which the optical active material portion is a thin-film, the absorption losses of the laser light in the nearby electric contact might be substantial. These absorption losses predominantly limit the differential efficiency of the laser. As discussed above, several precautions can be integrated in the design of the laser to minimize these losses, while preserving an optimal current path. These precautions might be lateral oxidation, proton-implant, vertical junctions, gratings, etc. Alternatively, this new laser concept permits to perform the lasing action in a ring or disk configuration, as discussed above. In a ring laser, the laser radiation is confined near the edge of the ridge waveguide. The top contact pad can be deposited on the ridge at the opponent edge of the ridge. In a disk laser, the whispering gallery mode is confined at the edge of the disk. The contact pad can be deposited on the center of the disk.

Figure 7:
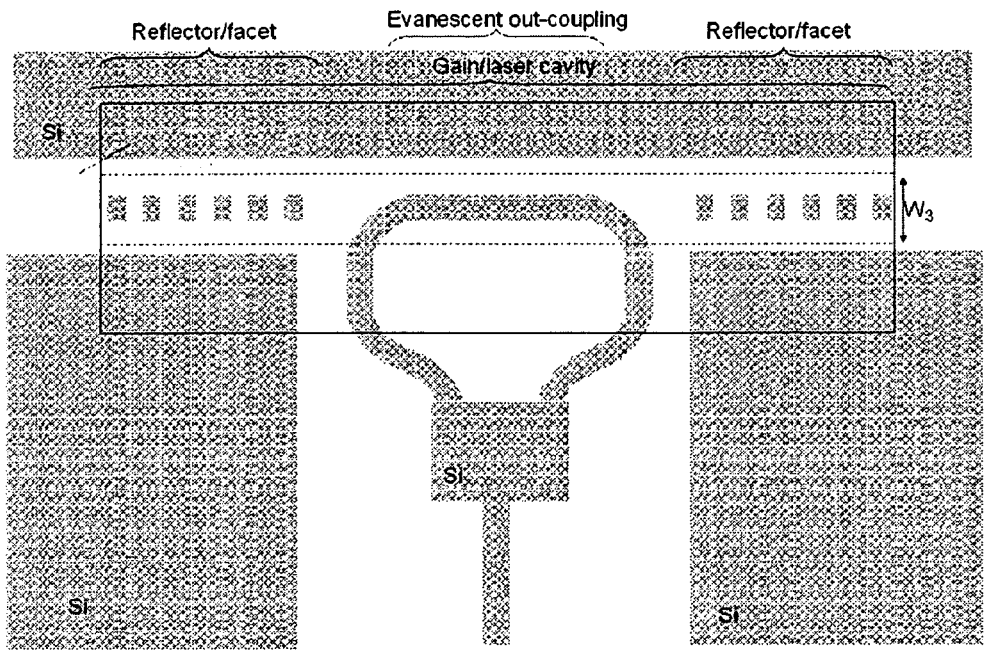
FIG. 7 illustrates a photonic integrated circuit wherein a combiner is provided in the optical waveguide in the optical passive material for combining counter propagating modes, as can be obtained using an embodiment of the present invention.

In the following exemplary embodiments according to the present invention, optional features are discussed for making optimal use of the generated laser radiation. The radiation in the hybrid laser is coupled out of the laser within the laser cavity. The extraction of the laser light is realized by evanescent coupling of the laser light from the optical active waveguide (ridge, ring, disk or other) to an optical passive waveguide. The laser radiation is then guided without extra insertion losses to the adjoining optical network. By the fact that this new laser concept couples out light within the laser cavity, the counter propagating modes in the cavity will couple to respectively counter propagating modes in the optical passive waveguide. For the same reflectivity of the laser mirrors, the power in both directions in this waveguide is of the same order of magnitude. It can be chosen to use only the fraction of light propagating in a single direction to be guided to the adjoining optical network. Nevertheless, advantageous embodiments may make use of both propagating modes. In one particular embodiment depicted in FIG. 7, a combiner is inserted between the optical passive waveguide and the adjoining optical network. When forming the combiner in the optical passive waveguide profiting from the accuracy of CMOS fabrication tools or e-beam, symmetry and accurate length control can be realized to obtain an insertion low loss combining of the counter propagating modes.

Figure 8:
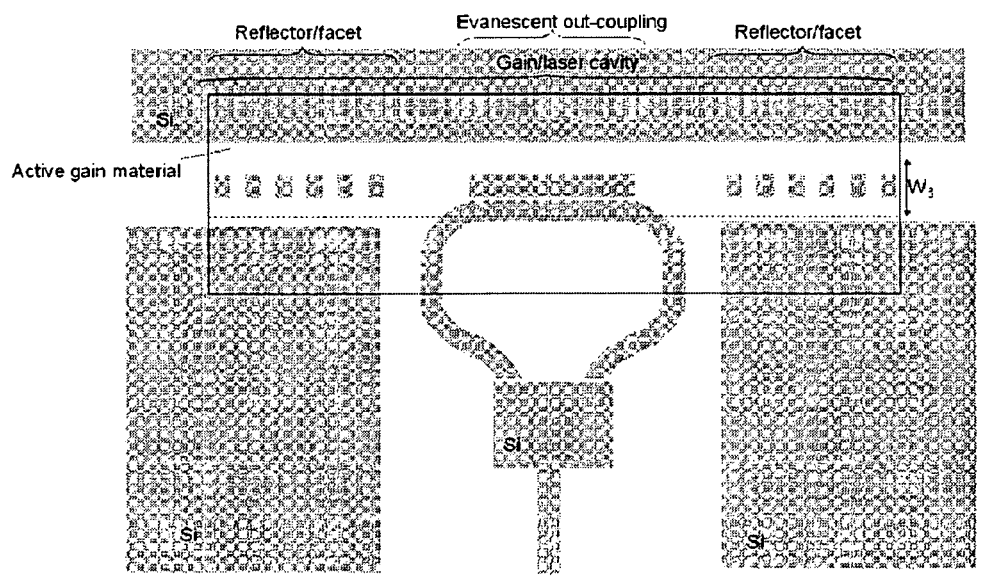
FIG. 8 illustrates a photonic integrated circuit as shown in FIG. 7, but wherein the combiner is configured to be operational through evanescent wave coupling from the optical passive material to the combiner.

Another embodiment is depicted in FIG. 8. Similar to the embodiment of FIG. 7, the counter propagating modes are combined by means of an inserted combiner, however, an extra step is introduced in which the light propagating in the optical passive waveguide is evanescently coupled to the combiner formed in the optical passive material.

Figure 9:
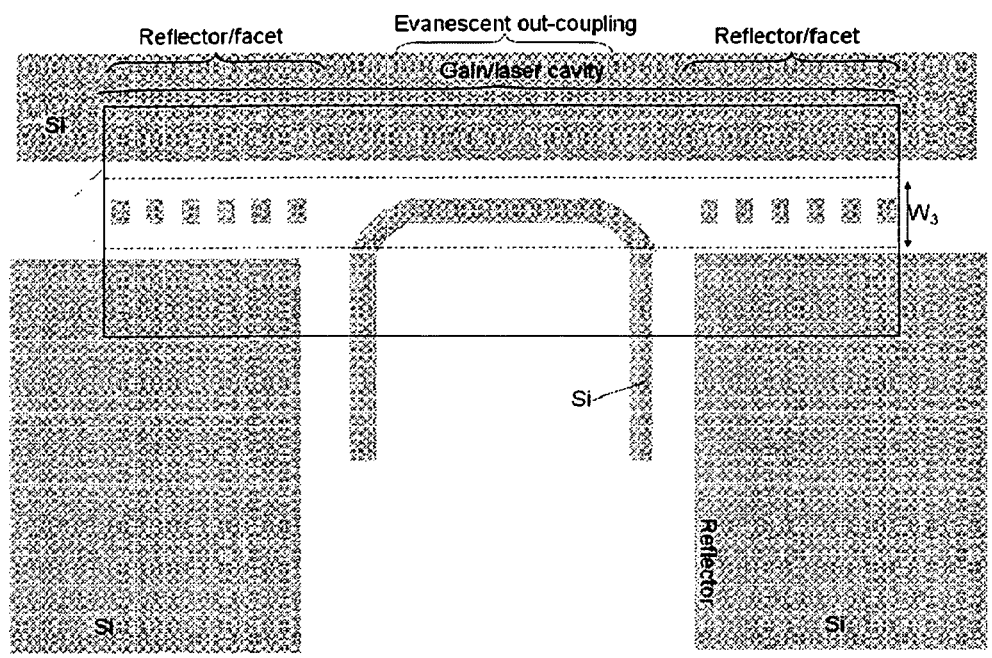
FIG. 9 illustrates a photonics integrated circuit behaving as a unidirectional microdisc or ring resonator laser, as can be obtained in an embodiment according to the present invention.
Figure 10A:
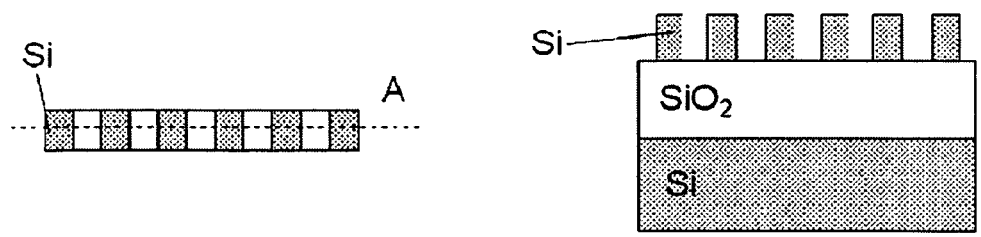
FIG. 10A to FIG. 10C illustrates reflective patterns that can be used as cavity mirrors, for use in particular embodiments according to the present invention.
Figure 10B:
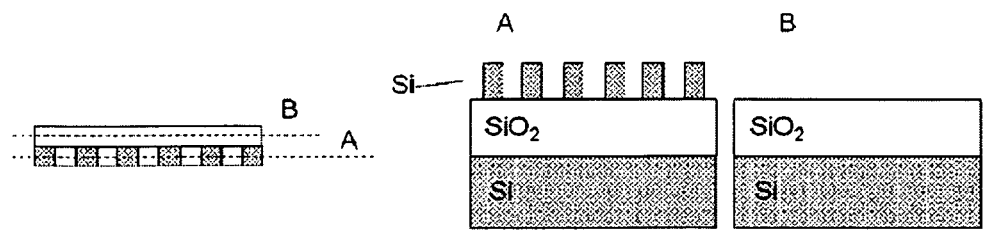
Figure 10C:
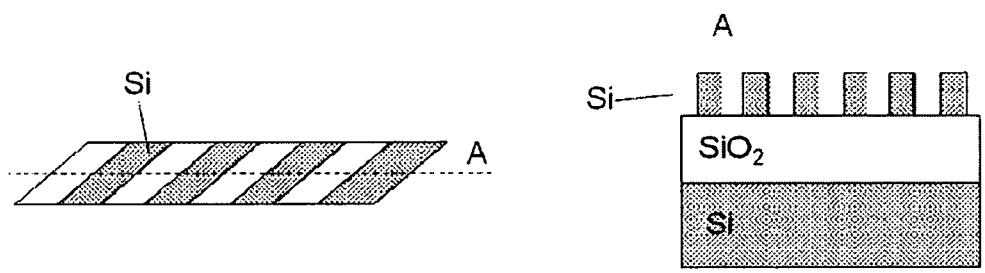

Another embodiment is depicted in FIG. 9. By the fact that the hybrid laser concept according to embodiments of the present invention couples out light within the laser cavity, it is possible to let the device behave similar to a unidirectional microdisk/ring resonator laser, regardless the shape of the laser (ridge, disk, ring or other). This unidirectional-like behavior is realized by using modal-asymmetric cavity reflectors. In such a system, the laser cavity mode travels in one direction as a ground mode and in the opposite direction as a first higher order mode. The reflectors thereby take care of mode conversion. The evanescent coupling to the optical passive waveguide works only for either the ground mode or the first higher order mode. This enables an isolator-free operation of the laser. A plurality of reflective patterns that can be used as cavity mirrors are depicted in FIG. 10A to FIG. 10C. FIG. 10A illustrates a DBR grating and a cross-section thereof, FIG. 10B illustrates an even-to-odd mode reflector and a cross-section thereof and FIG. 10C illustrates another example of an even-to-odd mode reflector and a cross-section thereof as can be used in embodiments of the present invention.

Figure 11:
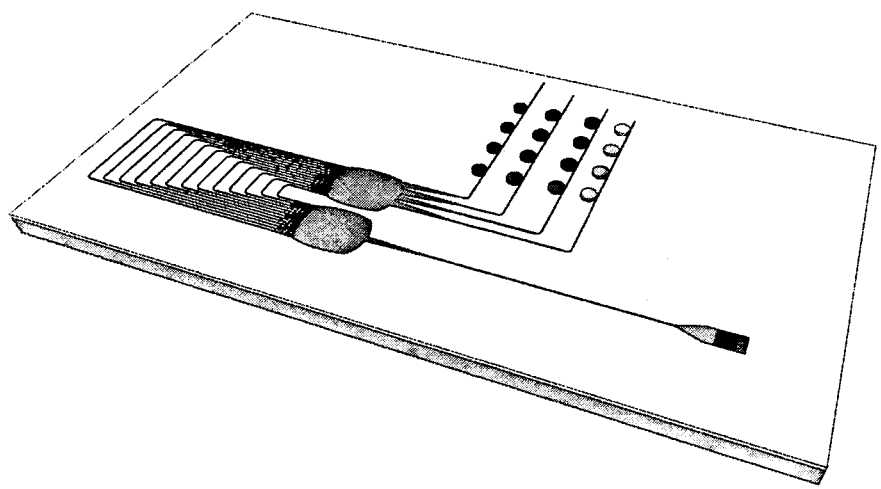
FIG. 11 illustrates an embodiment of a multi wavelength laser array according to embodiments of the present invention.

In one aspect, the present invention also relates to a photonic integrated circuit comprising at least one hybrid laser as described in any of the above described embodiments. Such a photonic integrated circuit may comprise, besides a hybrid laser, other optical components such as for example a multiplexer, a detector, etc. If an array of hybrid lasers is used, the latter may allow for multi wavelength applications or multi channel applications. In one particular example, there may be more than one silicon optical waveguide and cavity pattern disposed in the optical passive material to form a plurality of lasers. By combining a single optical active material with an optical passive material in which this plurality of optical waveguides and cavity patterns are defined, it is possible to fabricate arrays of multi-wavelength lasers in a single processing cycle. This array of multi-wavelength lasers may further be integrated with other integratable components such as for example silicon photonic components suitable for e.g multiplexing the wavelength into a single waveguide. Multi wavelength laser arrays can be used in telecom and datacom applications, e.g. CWDM and DWDM optical links; spectroscopy; biosensing; imaging; etc. Wavelength stability, single mode laser operation and efficiency (at least for thermal concerns) is essential in all of these applications. It is the advantage of at least some embodiments of this invention that by combining the accuracy of CMOS technology and the intelligent design of the device realizing high optical active region confinement and low coupling losses, these 3 conditions are met. On top of this, the integration of the devices on a single silicon chip will reduce drastically packaging in comparison with individually packaged devices. One embodiment of a multiwavelength laser array is presented in FIG. 11.

In one aspect, the present invention relates to a method of manufacturing a hybrid laser. It thereby is an advantage of at least some embodiments of the present invention that the components mainly determining the characteristics of the laser can be made using CMOS technology or alike. The method according to embodiments of the present invention comprises obtaining a substrate comprising an optical passive material, defining a first optical waveguide and optical laser components in the optical passive material at distinct different positions, obtaining an optical active material on the substrate, and defining a second optical waveguide in an optical active material so that an evanescent coupling interface is formed between the first optical waveguide and the second optical waveguide, the second optical waveguide being aligned with the optical laser components. By selecting a configuration, i.e. selecting a particular passive material, active material and bonding layer, radiation can be obtained in the active layer. The method may also comprise embedding the hybrid laser in an integrated photonics circuit, e.g. by processing the first substrate to introduce further components of the integrated photonics circuit different from the hybrid lasers, such components may be a variety of components such as other hybrid lasers, combiners, multiplexers, gratings, etc. The method also relates to packaging of such a photonic integrated circuit with at least one embedded hybrid laser as the latter can be performed in a single step, contrary to the need for packaging more or all components separately. Methods according to embodiments of the present invention may be especially useful for making a hybrid laser as described in the above embodiments, although the method is not limited thereto.

By way of illustration, embodiments of the present invention not being limited thereto, further features and advantages of some embodiments according to the present invention will be described with reference to an exemplary method of manufacturing set out below.

The method of manufacturing comprises in a first step obtaining a first substrate with an optical passive material. Obtaining such a substrate may comprise providing such a substrate by manufacturing, i.e. for example providing an optical passive material on a substrate carrier. Alternatively obtaining such a substrate may comprise obtaining a previously made substrate. The first substrate may be any type of substrate comprising an optical passive material. Advantageously, such a substrate may be a semiconductor on insulator substrate, such as for example a silicon on insulator substrate. By way of illustration, embodiments of the present invention not being limited thereto, the present example will be provided for a SOI substrate. In one particular example, the SOI structure may be a silicon wafer substrate with a buried oxide layer of more or less 2 micron and a top silicon layer of for example more or less 220 nm, 400 nm or 2000 nm, embodiments of the present invention not being limited to these thickness or materials. In the latter case the top silicon layer thus is the optical passive material envisaged.

The method also comprises defining the first optical waveguide and the optical laser components in the passive material. The waveguide and optical laser components comprising reflectors as well as optional other blocks are defined. The latter may encompass for example gratings, waveguides, modulators, etc. In the present exemplary method using SOI, these components are provided in the top silicon layer.

It is in this step that the optical laser components are defined, which may be patterns such as e.g. gratings, facets, tapers. It is not excluded that also electronics building blocks like transistors are defined as well in the substrate. The patterns can be defined in the silicon first substrate using e.g. one or more steps like lithographical steps, e,g, (deep) ultraviolet (D)UV lithography, e-beam, holography; etching steps e.g. reactive ion etching (RIE) or inductively coupled plasma reactive ion etching (ICP RIE), ablation, scribing, wet etching; deposition steps e.g. deposition of amorphous silicon; epitaxial steps e.g. local regrowth of silicon; implantation steps e.g. ion and proton implants; metalisation steps e.g. deposition or evaporation of metal contact pads.

The method also comprises obtaining an optical active material on the substrate so that an evanescent coupling interface is formed with the optical passive material. A plurality of techniques can be used for this. Two particular examples for providing an optical active material on the optical passive material are bonding, i.e. molecular direct bonding and adhesive bonding. In the particular exemplary method, embodiments of the present invention not limited thereto, a III-V semiconductor materials is provided on the SOI substrate. In the present example, active optical epiwafers, e.g. III-V epiwafers were formed. The active optical epiwafers typically have a multiple quantum well region or quantum dot region, but the concept is not limited hereto. The wafers can be left whole or be divided in dies by e.g. cleaving or dicing. One or more unpatterned active optical epiwafers or dies are bonded to the patterned silicon wafer, by means of e.g. a direct or adhesive bonding technology to the silicon platform. No stringent alignment is needed during this step. Direct bonding is for example realized by e.g. providing the active optical epiwafer or die and the patterned SOI wafer or die after a rigorous sample cleaning and sample preparation procedure. Adhesive bonding is realized by e.g. spin-coating of adhesive e.g. DVS-BCB, on the surface cleaned and conditioned patterned SOI wafer. After thermal treatment of the adhesive layer, e.g. 150° C. for 1 minute in case of DVS-BCB, both wafers or dies are brought into contact. This can be done with a controlled temperature to control the viscosity of the adhesive, e.g. at 15° C. when using DVS-BCB. The attachment of the epiwafer or dies on the silicon wafer or die can be done in clean room air, manually, by using tweezers or commercial wafer bonding solutions. After attachment of the III-V wafer or die, the adhesive has to be cured. When using e.g. DVS-BCB, the curing has to be performed in an atmosphere containing less than 100 ppm oxygen, to prevent the oxidation of the DVS-BCB. To achieve this, nitrogen is purged through the curing chamber. After bonding of the III-V epiwafer or die, the substrate e.g. InP or GaAs substrate needs to be removed, to be able to access and process the III-V e.g. InP/InGaAsP, epitaxial layers. The III-V substrate can be removed by complete wet chemical etching or by using a combination of mechanical grinding and wet chemical etching. Complete chemical etching of e.g. InP can be done using a mixture of HCl and H2O or a combination of HNO3:HCl and 3HCl:H2O. An InGaAs etch stop layer can be used, which shows nearly complete etching selectivity to InP when using HCl:

H2O. The thickness of the III-V wafer or die after removal of the substrate can vary from 50-500 nm (thin-film embodiments) or 500 nm-5 micron.

Once an optical active material, such as e.g. a III-V semiconductor material, has been provided, a waveguide can be defined therein, i.e. the optical active material can be patterned. Contact lithography can be used to define for example an optical active waveguide ridge, an optical active waveguide ring or an optical active waveguide disk pattern. It is important to note that the patterns to be defined in this step do not have submicron critical patterns. However, the patterns in the optical active material need to be aligned to the edges of the optical laser components defined in the optical passive material. Contact lithography can realize the needed alignment accuracy of the patterns defined in the optical active material towards the optical laser components defined in the optical passive material. The lithographically defined pattern then can be formed in the III-V material by etching e.g. using reactive ion etching (RIE) or Inductively coupled plasma-reactive ion etching (ICP-RIE).

Whereas in the above steps provision and definition of an optical active waveguide is based on bonding of an semiconductor wafer, alternative methods for providing also could be used. If for example epitaxial regrowth of III-V semiconductor materials, e.g. InP or GaAs, on silicon could be optimized to result in good photonic devices, fabrication of the III-V semiconductor—optical passive material stack as defined in the embodiments above using epitaxial regrowth also falls under the scope of this invention.

After defining the optical active waveguide, also referred to as the second optical waveguide, metal contact layer(s) and isolation layers e.g. oxides or divinylsiloxane-benzocyclobuten DVS-BCB, can be provided on the optical active material to form the contacts. An example process flow is e.g. deposition of metal layer e.g. titanium/platinum/gold metal layer on top of the optical active material to form the bottom contact. Afterwards, the whole structure is covered with divinylsiloxane-bis-benzocyclobutene DVS-BCB, a via is opened through the DVS-BCB layer on the ridge of the waveguide or disk or in the center of the disks and another titanium/platinum/gold metal layer is deposited to form the top contact.

Optionally, to enable heat dissipation, e.g. especially useful when operating under continuous-wave bias, a heat sink can be provided. It may for example be chosen to deposit a thick e.g. 600 nm e.g. gold layer to serve as a heat sink.

Bottom contacts also typically may be provided, e.g. by etching away the divinylsiloxane-benzocyclobuten DVS-BCB on part of the bottom contact metal to enable it to be contacted electrically.

Although a process flow of one order of different steps is discussed here, other orders may be utilized in other embodiments and more or fewer steps may be included in the process flow than discussed here. For example some additional optional steps known by the person skilled in the art also may be part of methods for manufacturing, preceding or intervening or following the steps as discussed above.

One example may be an optional definition of additional polymer structures on the first substrate. Other steps also may be provided corresponding with manufacturing of additional and/or optional features of the device.

In principle, only the evanescent tail of the optical mode residing in the III-V layer will overlap with the grating structure and therefore typically relatively long optical laser components, e.g. relatively long Bragg grating reflectors are required. Nevertheless, according to some embodiments of the present invention, longer optical laser components can be avoided, resulting in a small footprint of the hybrid laser, by using a particular type of optical laser components, being resonant cavity reflectors.

Figure 12A:
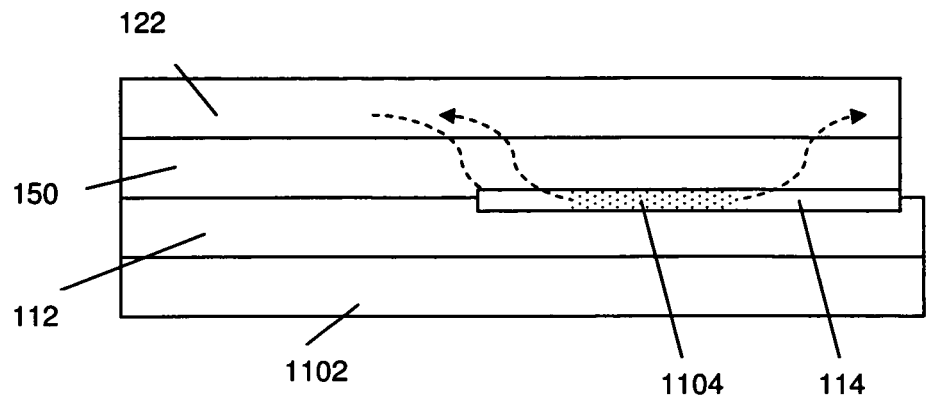
FIG. 12a and FIG. 12b illustrates an example of a hybrid laser using a resonant cavity reflector and part thereof, according to an embodiment of the present invention.
Figure 12B:
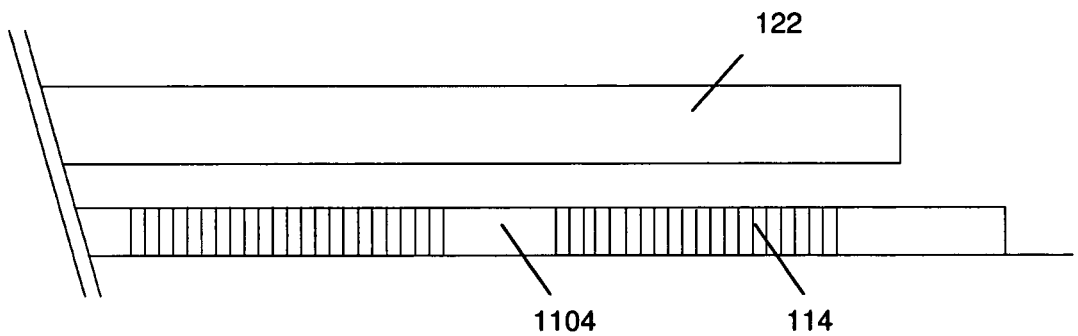

According to some embodiments of the present invention, resonant cavity mirrors can be used such that confinement of the mode in the active layer combined with compact grating mirrors defined in the silicon layer can be used for obtaining an efficient and compact hybrid laser. Such embodiments may comprise a waveguide system as described in any of the above aspects, embodiments or examples whereby at least one of the reflectors used for creating an optical cavity comprises a phase shifting section. Laser light thereby is generated in the active cavity. Resonant cavity reflectors, also referred to as cavity enhanced reflectors, thus are based on reflectors, wherein an additional phase-shifting section of half of the period is added to the reflector. Such relectors may be grating reflectors, also referred to as Bragg grating reflectors. The phase-shifting section may be a phase shifting section inducing a quarter wave shift. The phase shifting section may be achieved for example using an additional section of waveguide which breaks the periodicity of the Bragg grating or for example using a local overlay with a higher index material. By using such grating reflectors, radiation coupled from the active waveguide to the passive waveguide will start resonating in the passive waveguide cavity and power will be build up inside the cavity. FIG. 12a illustrates an example of a hybrid laser making use of a resonant cavity reflector. The optical passive waveguide 112, supported on a carrier substrate 1102 and optical laser component 114 in the present example being a Bragg grating reflector comprising a phase shift section 1104 is shown. Furthermore a bond layer 150 and the optical active waveguide 122 also are shown. In FIG. 12b, a more detailed picture of a resonant cavity reflector is shown, indicating the Bragg grating reflector 114 with the phase shift section 1104 and the second optical waveguide 122. The built-up power in the grating will couple back into the optical active waveguide both co-directionally and counter-directionally to the radiation in the optical active waveguide as indicated by the arrows in FIG. 12. By phase matching the optical active and the optical passive waveguide, the co-directionally coupled radiation will interfere destructively with the light inbound from the cavity resulting in zero transmission in the ideal case, while the counter-directionally coupled radiation will propagate back into the active waveguide cavity, resulting in high reflectivity. In this way the resonant cavity effect enhances the total reflection.

By way of illustration, embodiments of the present invention not being limited thereto, the effects of resonant cavity reflectors are illustrated below.

Figure 13:
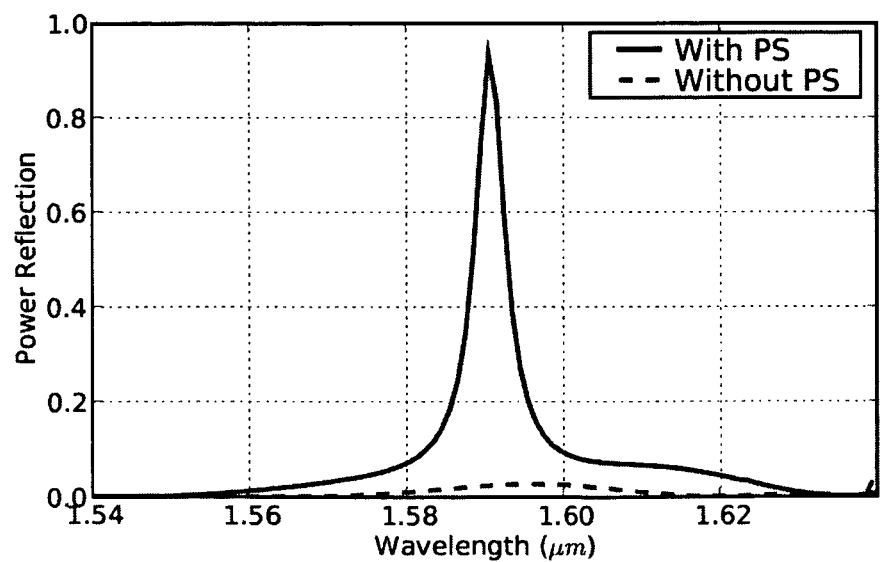
FIG. 13 illustrates the spectra of the active waveguide to active waveguide reflection with and without a phase shift section, illustrating advantages of one embodiment of the present invention.

The use of cavity enhanced reflectors has been studied using an open-source eigenmode solver CAMF for calculating the first order to first order mode reflection of the active waveguide as a function of wavelength. The simulations were performed for a 60 period shallow etched grating (70 nm etch depth, 300 nm period and 50% duty cycle) in a 220 nm high silicon ware. The grating's stopband ranges from 1.54 µm to 1.64 µm with a Bragg wavelength of 1.59 µm. A 250 nm high InP active waveguide is bonded on top of the grating using a 350 nm thick BCB layer. The thickness of the active layer thereby is chosen such that it is phase-matched to the silicon grating at the Bragg wavelength. The introduced phase section is in the present example not exactly at the center of the grating but shifted over a number of periods for counteracting asymmetric injection, in the present example being a shift over 4 periods to the left. This increases the maximum reflection. FIG. 13 shows the spectra of the active waveguide to active waveguide reflection with and without a phase section.

The dashed curve depicts the grating as an evanescent reflector in the Bragg regime. The limited overlap of the active waveguide mode with the silicon grating results in only 3% reflection. Adjusting the grating by adding a phase section, hence making it a resonant cavity, results in the solid curve, with a maximum reflection of 93%. When power profiles are calculated, the different reflection mechanisms can be established. Without phase section, the grating operated as evanescent Bragg reflector. In that case, a large part of the optical power was transmitted through the active waveguide with a substantially uniform profile along the length of the active waveguide and only little power is in the passive waveguide. With the phase section, in both active and passive optical waveguide, a standing wave pattern is obtained. In the passive optical grating around the phase section a pronounced field enhancement could be noted. In agreement with the foundings in FIG. 13, it also was seen that the majority of the radiation (about 93%) in the active waveguide was reflected by the grating.

Figure 14A:
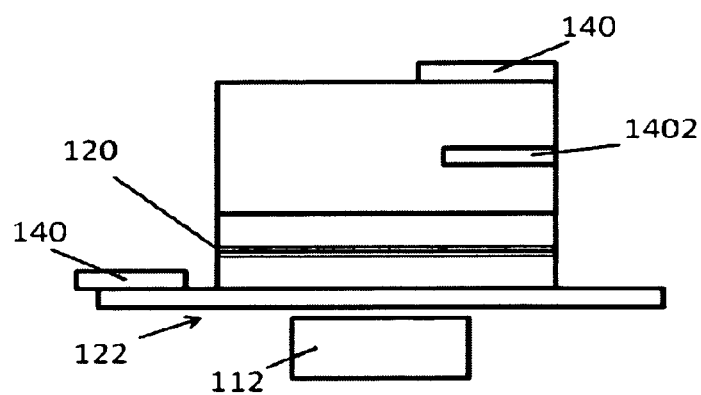
FIG. 14a, FIG. 14b and FIG. 14c illustrate a hybrid laser with curved waveguide configuration, a hybrid laser with straight waveguide configuration and an intensity distribution of the radiation for the straight waveguide configuration according to embodiments of the present invention.
Figure 14B:
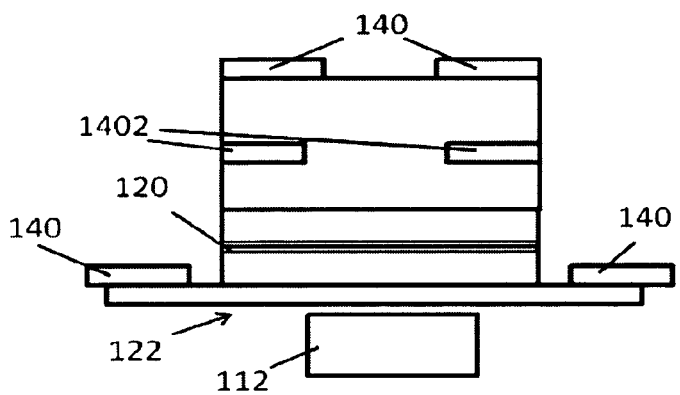
Figure 14C:
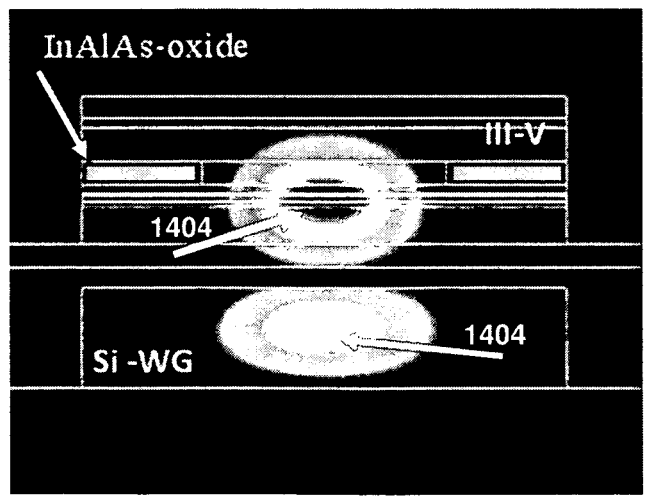

By way of illustration, embodiments of the present invention not being limited thereto, examples of a hybrid laser with a curved waveguide setup, a hybrid laser with a straight waveguide setup and radiation distribution in the hybrid laser with a straight waveguide setup are shown in FIG. 14a, FIG. 14b and FIG. 14c respectively. In the examples shown, lateral oxide windows are used for positioning the radiation and current in the waveguide. In the cross-sectional views for the hybrid lasers of FIG. 14a and FIG. 14b, the first optical waveguide 112, the optical active material 120 and the second optical waveguide 122 formed by doped semiconductor materials sandwiching an optical active material 120 and the electrodes 140 are shown. Furthermore, lateral oxide windows 1402 are also shown. It can be seen from FIG. 14a that the lateral oxide window 1402 can be positioned only at the outer curvature side because due to the curvature, radiation is automatically pushed away from the inner curvature side of the curved waveguide configuration. In FIG. 14C the radiation distribution is shown whereby it can be seen that radiation is present in both the first optical waveguide 112 and the second optical waveguide 122 for the straight waveguide configuration with two lateral oxide windows. The arrows 1404 indicate the direction of increasing radiation intensity.

While the invention has been illustrated and described in detail in the drawings and foregoing description, such illustration and description are to be considered illustrative or exemplary and not restrictive. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality The mere fact that certain measures are recited in mutually different dependent claims does not indicate that a combination of these measures cannot be used to advantage. Any reference signs in the claims should not be construed as limiting the scope.

The foregoing description details certain embodiments of the invention. It will be appreciated, however, that no matter how detailed the foregoing appears in text, the invention may be practiced in many ways, and is therefore not limited to the embodiments disclosed. It should be noted that the use of particular terminology when describing certain features or aspects of the invention should not be taken to imply that the terminology is being re-defined herein to be restricted to include any specific characteristics of the features or aspects of the invention with which that terminology is associated.

TABLE 1

| layer nb | layer type | nb of periods | material | thickness | carrier conc. | type |
|---|---|---|---|---|---|---|
| 1 | contact p inv | | InGaAs | 300 | 3.0E+19 | p |
| 2 | transition | | InGaAsP | 20 | 1.0E+19 | p |
| 3 | cladding p | | InP | 1000 | 5E18 -> 5E17 | p |
| 4 | cladding p | | InP | 500 | 5.0E+17 | p |
| 5 | SCH | | InGaAsP | 100 | | nid |
| 6 | MQW_b | 5 | InGaAsP | 10 | | nid |
| 7 | MQW_w | 6 | InGaAsP | 8 | | nid |
| 8 | SCH | | InGaAsP | 100 | | nid |
| 9 | cladding n | | InP | 200 | 1.0E+18 | n |
| 13 | Bonding layer | | BCB | 10-100 | | |
| 14 | Si Waveguide | | Si | 220&400 | | |
| 15 | Buried Oxide | | SiOx | 2000 | | |

TABLE 2

| layer nb | layer type | nb of periods | material | thickness (nm) | carrier conc. | type |
|---|---|---|---|---|---|---|
| 1 | Top Contact | | InP | 80 | 5E18 -> 1E18 | nid |
| 5 | TJ | | Q1.2 | 20 | 1.0E+19 | p |
| 6 | TJ | | Q1.2 | 20 | 2.0E+19 | p |
| 7 | P | | InP | 135 | 1E18 -> 5E17 | p |
| 8 | SCL | | Q1.2 | 25 | | nid |
| 9 | MQW_b | 3 | Q1.2 | 15 | | nid |
| 10 | MQW_w | 3 | InAsP | 6 | | nid |
| 11 | N | | Q1.2 | 120 | | N |
| 11 | SCL | | Q1.2 | 25 | | nid |
| 12 | Bottom contact | | InP | 95 | 5.0E+18 | N |
| 13 | Bonding layer | | BCB | 10-100 | | |
| 14 | Si Waveguide | | Si | 220 | | |
| 15 | Buried Oxide | | SiOx | 2000 | | |

The invention claimed is:

1. A hybrid laser for generating radiation, the hybrid laser comprising an optical passive material and an optical active material, the hybrid laser furthermore comprising:
   a first optical waveguide and optical laser components defined in the optical passive material,
   a second optical waveguide defined in the optical active material,
   wherein the second optical waveguide is positioned at least partly over the first optical waveguide so that an evanescent coupling interface is defined between the second optical waveguide and the first optical waveguide to couple radiation from the second optical waveguide to the first optical waveguide,
   the optical laser components comprising reflectors, the reflectors defining a cavity and being arranged to provide laser cavity confinement for the radiation in the first optical waveguide and the second optical waveguide by means of overlap of an optical mode guided by the second optical waveguide and the optical laser components,
   wherein the hybrid laser is arranged to provide amplification of the radiation in the second optical waveguide, the evanescent coupling interface between the first and the second optical waveguides being positioned within the cavity, and the first optical waveguide is arranged to couple out radiation from the hybrid laser.

2. A hybrid laser according to claim 1, wherein the optical passive material is a CMOS compatible material.

3. A hybrid laser according to claim 1, wherein the first optical waveguide and the optical laser components are defined in the optical passive material at distinct different positions.

4. A hybrid laser according to claim 1, wherein the reflectors are any of a Bragg grating reflectors, a mirror or a waveguide loop mirror.

5. A hybrid laser according to claim 4, wherein at least one of the reflectors is a Bragg grating reflector comprising a phase shifting section.

6. A hybrid laser according to claim 1, the hybrid laser comprising a current injection device defining a current injection path in the second optical waveguide, wherein the second optical waveguide and the optical laser components are positioned such that the optical mode in the second optical waveguide and the current injection path overlap at least 5%.

7. A hybrid laser according to claim 1, wherein the second optical waveguide comprises a thin film waveguide.

8. A hybrid laser according to claim 6, wherein the hybrid laser comprises metal contacts providing current injection and wherein any of lateral oxidation, gratings, indium tin oxide or proton implants are implemented between the metal contacts and the second optical waveguide to avoid absorption of radiation in the metal contacts.

9. A hybrid laser according to claim 1, wherein the second optical waveguide is any of a straight waveguide, a curved waveguide, an open or closed ring waveguide or part thereof or a full or partially disc shaped waveguide or part thereof.

10. A hybrid laser according to claim 9, the second optical waveguide being a curved waveguide, ring waveguide or part thereof or a disc waveguide or part thereof, wherein metal contacts for current injection in the second optical waveguide are positioned at the inner side of the curved waveguide, ring waveguide or part thereof or the disc waveguide or part thereof so that radiation is guided away from the contacts when the radiation travels in the curved waveguide, ring or disc.

11. A hybrid laser according to claim 1, wherein a bonding layer is present between the optical passive material and the optical active material and/or wherein the hybrid laser comprises a set of first waveguides and a set of optical laser elements so as to form a plurality of laser channels.

12. A hybrid laser according to claim 1, wherein the optical passive material is one of the group of silicon, germanium, silicon germanium, silicon nitride, silicon carbide or SOI and the optical active material is a III-V semiconductor.

13. A hybrid laser according to claim 1, the hybrid laser comprising a set of first waveguides and a set of optical laser elements so as to form a plurality of laser channels.

14. A hybrid laser according to claim 1, wherein the hybrid laser is part of an integrated photonic circuit.

15. A hybrid laser according to claim 1, wherein the optical laser components comprise modal-asymmetric cavity reflectors.

16. Use of the hybrid laser recited in claim 1 to generate an optical link, for spectroscopy, for biosensing or for imaging.

17. A method for making a hybrid laser, comprising the steps:

obtaining a substrate comprising an optical passive material, defining a first optical waveguide arranged to couple out radiation from the hybrid laser and optical laser components in the optical passive material, obtaining an optical active material on the substrate defining a second optical waveguide in the optical active material, wherein said obtaining the second optical waveguide comprises obtaining the second optical waveguide so that an evanescent coupling interface is formed between the first optical waveguide and the second optical waveguide for coupling radiation from the second optical waveguide to the first optical waveguide, wherein said defining comprises defining the laser components comprising reflectors defining a cavity and being arranged to provide laser cavity confinement in the first optical waveguide and the second optical waveguide, and wherein the evanescent coupling interface is positioned within the laser cavity.

* * * * *